(12) United States Patent
Beerel et al.

(10) Patent No.: US 7,197,691 B2
(45) Date of Patent: Mar. 27, 2007

(54) REDUCED-LATENCY SOFT-IN/SOFT-OUT MODULE

(75) Inventors: Peter A. Beerel, Westminister, CA (US); Keith M. Chugg, Burbank, CA (US); Georgios D. Dimou, San Diego, CA (US); Phunsak Thiennviboon, San Diego, CA (US)

(73) Assignee: University of Southern California, Los Angeles, CA (US)

( * ) Notice: Subject to any disclaimer, the term of this patent is extended or adjusted under 35 U.S.C. 154(b) by 0 days.

(21) Appl. No.: 10/875,979

(22) Filed: Jun. 24, 2004

(65) Prior Publication Data

US 2004/0237025 A1 Nov. 25, 2004

Related U.S. Application Data

(62) Division of application No. 09/848,778, filed on May 3, 2001.

(60) Provisional application No. 60/201,583, filed on May 3, 2000.

(51) Int. Cl.
*H03M 13/03* (2006.01)

(52) U.S. Cl. ............... 714/795; 714/796; 714/786; 375/341; 375/262; 375/265

(58) Field of Classification Search .............. 714/795, 714/786, 755, 796, 792; 375/341, 262, 265
See application file for complete search history.

(56) References Cited

U.S. PATENT DOCUMENTS

| | | | |
|---|---|---|---|
| 4,853,930 A | 8/1989 | Shimada | |
| 5,014,276 A | 5/1991 | Bush et al. | |
| 5,233,349 A | 8/1993 | Moulsley | |
| 5,930,272 A | 7/1999 | Thesling | |
| 5,933,462 A * | 8/1999 | Viterbi et al. | 375/341 |
| 6,233,290 B1 | 5/2001 | Raphaeli | |
| 6,304,996 B1 | 10/2001 | Van Stralen et al. | |
| 6,343,103 B1 * | 1/2002 | Lou et al. | 375/261 |
| 6,484,283 B2 * | 11/2002 | Stephen et al. | 714/786 |
| 6,507,927 B1 * | 1/2003 | Kalliojarvi | 714/795 |
| 6,769,007 B2 * | 7/2004 | Sutherland et al. | 708/700 |

OTHER PUBLICATIONS

Wiberg, "Codes and Decoding on General Graphs", Dept. of Electrical Engineering, Sinkoping University, S-581 83 Sinkoping, Sweden, Dissertation No. 440 (1996).

(Continued)

*Primary Examiner*—Guy Lamarre
*Assistant Examiner*—Fritz Alphonse
(74) *Attorney, Agent, or Firm*—Fish & Richardson P.C.

(57) ABSTRACT

Decoding an encoded signal (for example, a turbo encoded signal, a block encoded signal or the like) is performed by demodulating the received encoded signal to produce soft information, and iteratively processing the soft information with one or more soft-in/soft-output (SISO) modules. At least one of the SISO modules uses a tree structure to compute forward and backward state metrics. More generally, iterative detection is performed by receiving an input signal corresponding to one or more outputs of a module whose soft-inverse can be computed by running the forward-backward algorithm on a trellis representation of the module, and determining the soft inverse of the module by computing forward and backward state metrics of the received input signal using a tree structure.

16 Claims, 12 Drawing Sheets

OTHER PUBLICATIONS

Chugg et al., "Efficient architectures for soft-output algorithms", Communications, ICC 98, Conference Record, 1998 IEEE International Conference, vol. 1, pp. 126-130 (1998).

Divsalar et al., "Hybrid Concatenated Codes and Iterative Decoding", TDA Progress Report 42-130, Aug. 15, 1997.

Berrou et al., "An IC for Turbo-Codes Encoding and Decoding", IEEE Solid-State Circuits Conference, Digest of Technical Papers, ISSCC 95, Session 5, Paper WP 5.7 (1995).

Hamkins, "Performance of Binary Turbo-Coded 256-ary Pulse-Position Modulation", TMO Progress Report 42-138, Aug. 15, 1999.

Berrou et al., "Near Shannon limit error-correcting coding and decoding: Turbo-codes", Communications, ICC 93 Geneva, Technical Program, Conference Record, IEEE International Conference, vol. 2, pp. 1064-1070 (1993).

Yiin et al., "MLSE and Soft-Output Equalization for Trellis-Coded Continuous Phase Modulation", IEEE Transactions on Communications, vol. 45, No. 6, Jun. 1997, pp. 651-659.

Berrou et al., "Near Optimum Error Correcting Coding and Decoding: Turbo-Codes", IEEE Transactions on Communications, vol. 44, No. 10, Oct. 1996, pp. 1261-1271.

Forney, "The Forward-Backward Algorithm", Proceedings of the Thirty-fourth Annual Allerton Conference on Communication, Control and Computing, Oct. 2-Oct. 4, 1996, pp. 432-446.

Aji, et al., "The Generalized Distributive Law", IEEE Trans. Inform. Theory, 46(2):325-343, Mar. 2000.

Cormen, et al., "Introduction to Algorithms", The MIT Press, Cambridge, Mass., 1990.

Brent, et al., "A Regular Layout for Parallel Adders", IEEE Transactions on Computers, C-31:260-264, Mar. 1982.

Despain, Chapter 2: "Notes on computer architecture for high performance", in New Computer Architectures, Academic Pres, 1984.

S. Benedetto, D. Divsalar, G. Montorsi, and F. Pollara, Soft-Output Decoding Algorithms in Iterative Decoding of Turbo Codes, TDA progress Report 42-124, Feb. 15, 1996.

D. Divsalar and F. Pollara, Hybrid Concatenated Codes and Iterative Decoding, TDA progress Report 42-130, Aug. 15, 1997.

Arjhan et al., "A Novel Scheme for Irregular Parallel-Prefix Adders", IEEE Proceedings, 12-14, 1997, pp. 74-78.

Gurkaynak et al., "Higher Radix Kogge-Stone Parallel Prefix Adder Architectures", IEEE International Symposium on Circuits and Systems, May 28-31, 2000, Geneva, Switzerland, pp. V609-V612.

Dimitrakopoulos et al., "High-Speed Parallel-Prefix VLSI ling Adders", IEEE Transactions on Computers, vol. 54, No. 2, Feb. 2005.

Janik et al., "VLSI Implementation of a 32-Bit Kozen Formulation Ladner/Fischer Parallel Prefix Adder", IEEE Proceedings, 1995, pp. 57-59.

Hagenauer et al., "A Viterbi Algorithm with soft-decision outputs and its applications", IEEE GLOBECOM, Nov. 27-30, 1989, vol. 3, pp. 1680-1686.

Leighton, "Introduction to Parallel Algorithms and Architectures: Arrays-Trees-Hypercubes", Morgan Kaufmann Publishers, Inc., 1992, pp. 1-3, 36-45, 238 and 239.

Hsu, et al., "A Parallel Decoding Scheme for Turbo Codes", IEEE International Symposium on Circuits and Systems, Mar. 1998, vol. 4, pp. IV445-448.

Ochi et al., "A High-Speed Decoding Method for Turbo-Code by Means of parallel Processing of Map Algolithms", Engineering Research Report of the Institute of Electronics, Information, and Communication Engineers, Jan. 27, 1998, vol. 97, No. 511, pp. 1-6.

Brent et al., "A Regular Layout for Parallel Adders", IEEE Transactions on Computers, Mar. 1982, vol. C-31, No. 3, pp. 260-264.

* cited by examiner

REDUCED-LATENCY SOFT-IN/SOFT-OUT MODULE

RELATED APPLICATION

This application is a divisional, and claims the benefit of priority under 35 USC 120, of U.S. application Ser. No. 09/848,778, filed May 3, 2001, which claims the benefit of U.S. Provisional Patent Application No. 60/201,583, filed May 3, 2000.

ORIGIN OF INVENTION

The research and development described herein were supported by the National Science Foundation under grant number NCR-CCR-9726391. The US government may have certain rights in the claimed inventions.

FIELD OF THE INVENTION

The present application describes techniques for iterative detection or decoding of concatenated codes. More specifically, this application relates to computing the soft-inverse of a finite-state machine (i.e., the soft-in/soft-out or "SISO" module), for example, such as used in turbo decoders.

BACKGROUND

Due to the presence of noise on a communications channel, the signal received is not always identical to the signal transmitted. Channel coding, or equivalently, error correction coding, relates to techniques for increasing the probability that a receiver in a communications systems will be able to correctly detect the composition of the transmitted data stream. Typically, this is accomplished by encoding the signal to add redundancy before it is transmitted. This redundancy increases the likelihood that the receiver will be able to correctly decode the encoded signal and recover the original data.

Turbo coding, a relatively new but widely used channel coding technique, has made signaling at power efficiencies close to the theoretical limits possible. The features of a turbo code include parallel code concatenation, non-uniform interleaving, and iterative decoding. Because turbo codes may substantially improve energy efficiency, they are attractive for use over channels that are power and/or interference limited.

A turbo decoder may be used to decode the turbo code. The turbo decoder may include two soft-input/soft-output (SISO) decoding modules that work together in an iterative fashion.

The SISO decoding module is the basic building block for established iterative detection techniques for a system having a network of finite state machines, or more generally, subsystems.

FIGS. 7A and 7B respectively show block diagrams of typical turbo encoder 10 and turbo decoder 11 arrangements. In this example, the turbo encoder 10 uses two separate encoders, RSC1 and RSC2, each a Recursive Systematic Convolutional encoder. Each of the encoders RSC1 and RSC2 can be modeled as a finite state machine (FSM) having a certain number of states (typically, either four or eight for turbo encoders) and transitions therebetween. To encode a bit stream for transmission over a channel, uncoded data bits $b_k$ are input both to the first encoder RSC1 and an interleaver I. The interleaver I shuffles the input sequence $b_k$ to increase randomness and introduces the shuffled sequence $a_k$ to the second decoder RSC2. The outputs of encoders RSC1 and RSC2, $c_k$ and $d_k$ respectively, are punctured and modulated by block 12 to produced encoded outputs $x_k(0)$ and $x_k(1)$, which are transmitted over a channel to the decoder 11.

At the decoder 11, the encoded outputs are received as noisy inputs $z_k(0)$ and $z_k(1)$ and are de-modulated and de-punctured by block 13, which is the soft-inverse of puncture and modulation block 12. The output of block 13, $M[c_k(0)]$, $M[c_k(1)]$ and $M[d_k(1)]$, is "soft" information—that is, guesses or beliefs about the most likely sequence of information bits to have been transmitted in the coded sequences $c_k(0)$, $c_k(1)$ and $d_k(1)$, respectively. The decoding process continues by passing the received soft information $M[c_k(0)]$, $M[c_k(1)]$ to the first decoder, SISO1, which makes an estimate of the transmitted information to produce soft output $M[b_k]$ and passes it to interleaver I (which uses the same interleaving mapping as the interleaver I in the encoder 10) to generate $M[a_k]$. The second decoder, SISO2, uses $M[a_k]$ and received soft information $M[d_k(1)]$ to re-estimate the information. This second estimation is looped back, via the soft inverse of the interleaver, $I^{-1}$, to SISO1 where the estimation process starts again. The iterative process continues until certain conditions are met, such as a certain number of iterations are performed, at which point the final soft estimates become "hard" outputs representing the transmitted information.

Each of the SISO decoder modules in the decoder 11 is the soft-inverse of its counterpart RSC encoder in the encoder 10. The conventional algorithm for computing the soft-inverse is known as the "forward-backward" algorithm such as described in G. David Forney, Jr., "The Forward-Backward Algorithm," Proceedings of the $34^{th}$ Allerton Conference on Communications, Control and Computing, pp. 432–446 (October 1996). In the forward-backward algorithm, an estimate as to a value of a data bit is made by recursively computing the least cost path (using add-compare-select, or ACS, operations) forwards and backwards through the SISO's "trellis"—essentially an unfolded state diagram showing all possible transitions between states in a FSM. Each path through the SISO's trellis has a corresponding cost, based on the received noisy inputs, representing a likelihood that the RSC took a particular path through its trellis when encoding the data. Typically, the lower a path's total cost, the higher the probability that the RSC made the corresponding transitions in encoding the data. In general, the forward and backward ACS recursions performed by a SISO can be computed either serially or in parallel. Performing the recursions in parallel, the faster of the two methods, yields an architecture with latency O(N), where N is the block size of the encoded data. As used herein, "latency" is the end-to-end delay for decoding a block of N bits.

The present inventors recognized that, depending on the latency of other components in a decoder or other detection system, reducing the latency of a SISO could result in a significant improvement in the system's throughput (a measurement of the number of bits per second that a system architecture can process). Consequently, the present inventors developed a tree-structured SISO that can provide reduced latency.

SUMMARY

Implementations of the tree-structured SISO may include various combinations of the following features.

In one aspect, decoding an encoded signal (for example, a turbo encoded signal, a block encoded signal or the like) can be performed, e.g., in a wireless communications system, by demodulating the received encoded signal to produce soft information, and iteratively processing the soft information with one or more soft-in/soft-output (SISO) modules. At least one of the SISO modules uses a tree structure to compute forward and backward state metrics, for example, by performing recursive marginalization-combining operations, which in various embodiments includes min-sum operations, min*-sum operations (where $\min^* = \min(x,y) - \ln(1 + e^{-|x-y|})$), sum-product operations, and/or max-product operations.

The encoded signal may comprise at least one of a turbo encoded signal, a block turbo encoded signal, a low density parity check coded signal, a product coded signal, a convolutional coded signal, a parallel concatenated convolutional coded signal, and/or a serial concatenated convolutional coded signal.

The iterative processing may be terminated upon occurrence of a predetermined condition, for example, the completion of a predetermined number of iterations. The iterative processing may include performing parallel prefix operation or parallel suffix operations, or both, on the soft information. Moreover, the iterative processing may include using soft output of a first SISO as soft input to another SISO, and/or may include performing marginalization-combining operations which form a semi-ring over the soft-information.

The tree structure used by at least one SISO may be a tree structure that results in the SISO having a latency of $O(\log_2 N)$, where N is a block size, a Brent-Kung tree, or a forward-backward tree, e.g., having a tree structure recursion that is bi-directional.

Processing performed by at least one SISO may include tiling an observation interval into subintervals, and applying a minimum half-window SISO operation on each subinterval.

In another aspect, a SISO module may include a plurality of fusion modules arranged into a tree structure and adapted to compute forward and backward state metrics. Each fusion module may be defined by the equation:

$$C(k_0, k_1) \triangleq C(k_0, m) \otimes_C C(m, k_1) \Leftrightarrow C(s_{k_0}, s_{k_1}) = \min_{s_m}[C(s_{k_0}, s_m) + C(s_m, s_{k_1})] \forall s_{k_0}, s_{k_1}$$

where C(k, m) is a matrix of minimum sequence metrics (MSM) of state pairs $s_k$ and $s_m$ based on soft-inputs between $s_k$ and $s_m$. At least one of the fusion modules may compute forward and backward state metrics by performing recursive marginalization-combining operations.

In another aspect, a SISO module may include one or more complete fusion modules (CFMs) for performing marginalization-combining operations in both a forward direction and a backward direction, one or more forward fusion modules (fFMs) for performing marginalization-combining operations only in the forward direction, and one or more backward fusion modules (bFMs) for performing marginalization-combining operations only in the backward direction. The one or more CFMs, fFMs, and bFMs are arranged into a tree structure (e.g., Brent-Kung tree, forward-backward tree). An amount of the CFMs may be set to a minimum number needed to compute a soft-inverse. In general, fFMs and bFMs may be used in the tree structure in place of CFMs wherever possible.

In another aspect, iterative detection may include receiving an input signal (e.g., a turbo encoded signal or a convolutional coded signal) corresponding to one or more outputs of a finite state machine (FSM), and determining the soft inverse of the FSM by computing forward and backward state metrics of the received input signal using a tree structure. The forward and backward state metrics may be computed by one or more SISO modules, for example, using a tree-structured set of marginalization-combining operations.

Determining the soft inverse of the FSM may include iteratively processing soft information, for example, performing parallel prefix operation or parallel suffix operations, or both, on the soft information. Moreover, the iterative processing may include using soft output of a first SISO as soft input to another SISO. At least one SISO further may tile an observation interval into subintervals, and apply a minimum half-window SISO operation on each subinterval.

In another aspect, a turbo decoder includes a demodulator adapted to receive as input a signal encoded by a FSM and to produce soft information relating to the received signal, and at least one SISO module in communication with the demodulator and adapted to compute a soft-inverse of the FSM using a tree structure. The tree structure may implement a combination of parallel prefix and parallel suffix operations.

The turbo decoder may include at least two SISO modules in communication with each other. In that case, the SISO modules may iteratively exchange soft information estimates of the decoded signal. In any event, at least one SISO may compute the soft-inverse of the FSM by computing forward and backward state metrics of the received signal.

In another aspect, iterative detection may be performed by receiving an input signal corresponding to output from one or more block encoding modules, and determining the soft inverse of the one or more block encoding modules by computing forward and backward state metrics of the received input signal using a tree structure. The input signal may include a block turbo encoded signal, a low density parity check coded signal, and/or a product coded signal.

Determining the soft inverse of the block encoding module may include iteratively processing soft information, for example, performing parallel prefix operation or parallel suffix operations, or both, on the soft information.

In another aspect a block decoder may include a demodulator adapted to receive as input a signal encoded by a block encoding module and to produce soft information relating to the received signal, and at least one SISO module in communication with the demodulator and adapted to compute a soft-inverse of the block encoding module using a tree structure. The tree structure used may implement a combination of parallel prefix and parallel suffix operations. The block decoder may further include at least two SISO modules in communication with each other, wherein the SISO modules iteratively exchange soft information estimates of the decoded signal. In any event, at least one SISO may compute the soft-inverse of the block encoding module by computing forward and backward state metrics of the received signal.

In another aspect, iterative detection may include receiving an input signal (e.g., a block error correction encoded signal, a block turbo encoded signal, a low density parity check coded signal, and/or a product coded signal) corresponding to one or more outputs of a module whose soft-inverse can be computed by running the forward-backward algorithm on a trellis representation of the module (e.g., a FSM or a block encoding module), and determining the soft inverse of the module by computing forward and backward state metrics of the received input signal using a tree structure.

One or more of the following advantages may be provided. The techniques and methods described here result in a tree-structure SISO module that can have a reduced latency as low as O(lg N) [where N is the block size and "lg" denotes $\log_2$] in contrast to conventional SISOs performing forward-back recursions in parallel, which have latency O(N). The decrease in latency comes primarily at a cost of chip area, with, in some cases, only a marginal increase in computational complexity. This tree-structure SISO can be used to design a very high throughput turbo decoder, or more generally an iterative detector. Various sub-windowing and tiling schemes also can be used to further improve latency.

These reduced-latency SISOs can be used in virtually any environment where it is desirable or necessary to run the forward-backward algorithm on a trellis. For example, the tree-SISO finds application in wireless communications and in many types of decoding (turbo decoding, block turbo decoding, convolutional coding including both parallel concatenated convolutional codes and serial concatenated convolutional codes, parity check coding including low density parity check (LDPC) codes, product codes and more generally in iterative detection). The reduced-latency SISOs are particularly advantageous when applied to decode FSMs having a relatively small number of states, such as turbo code FSMs which typically have either 4 or 8 states.

The details of one or more embodiments are set forth in the accompanying drawings and the description below. Other features, objects, and advantages of the invention will be apparent from the description and drawings, and from the claims.

DRAWING DESCRIPTIONS

DETAILED DESCRIPTION

Figure 1:
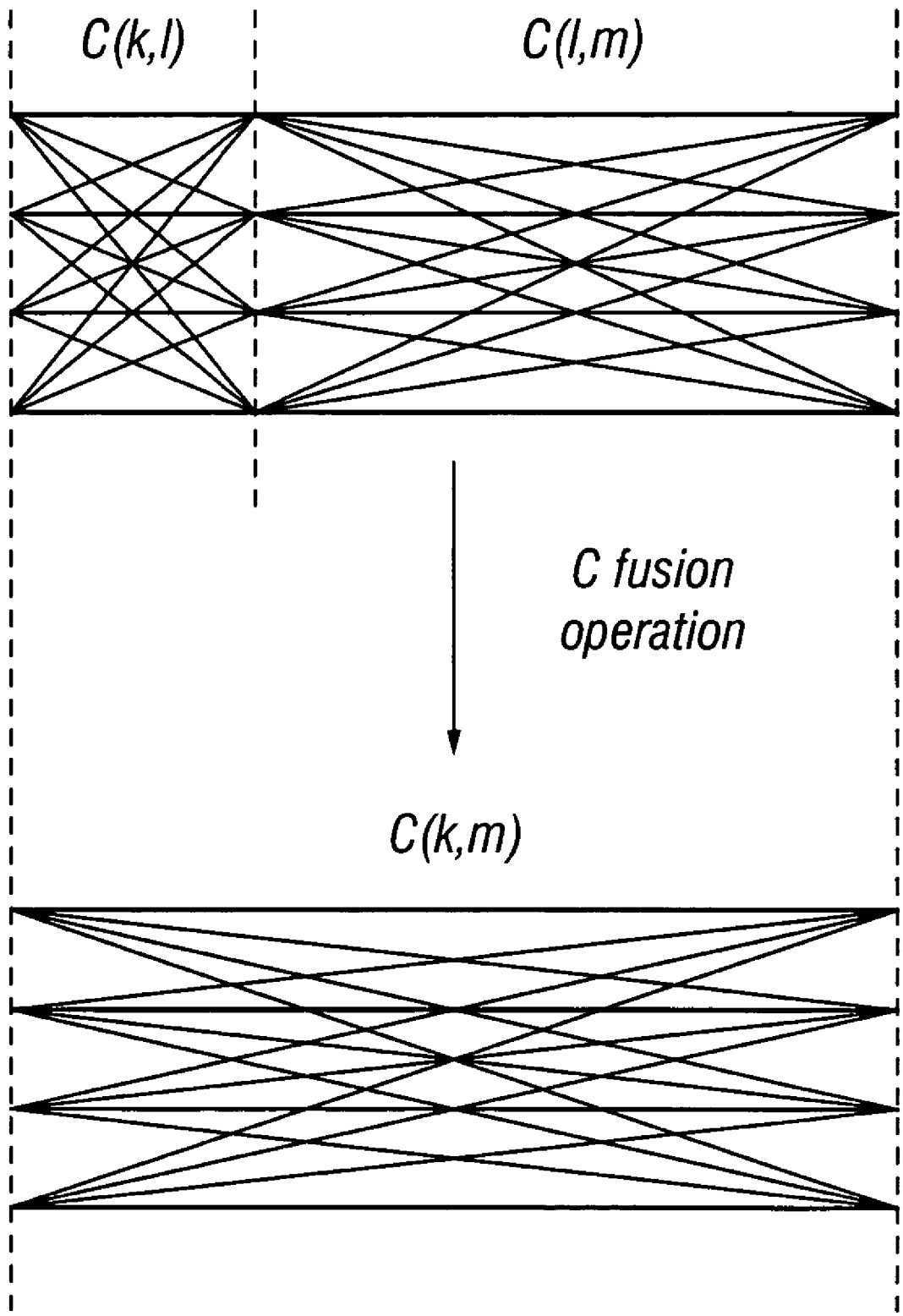
FIG. 1 shows the C fusion process.

The present inventors have developed a re-formulation of the standard SISO computation using a combination of prefix and suffix operations. This architecture—referred to as a Tree-SISO—is based on tree-structures for fast parallel prefix computations used in Very Large Scale Integration (VLSI) applications such as fast-adders. Details of the Tree-SISO and various alternative embodiments follow.

Calculating the "soft-inverse" of a finite-state machine (FSM) is a key operation in many data detection/decoding algorithms. One of the more prevalent applications is iterative decoding of concatenated codes, such as turbo codes as described in Berrou, et al., "Near shannon limit error-correcting coding and decoding: turbo-codes," *International Conference on Communications*, (Geneva, Switzerland), pp. 1064–1070, May 1993; and Berrou, et al., "Near optimum error correcting coding and decoding: turbo-codes," *IEEE Trans. Commun.*, vol. 44, pp. 1261–1271, October 1996. However the SISO (soft-in/soft-out) module is widely applicable in iterative and non-iterative receivers and signal processing devices. The soft-outputs generated by a SISO may also be thresholded to obtain optimal hard decisions (e.g., producing the same decisions as the Viterbi algorithm (G. D. Forney, "The Viterbi algorithm," *Proc. IEEE*, vol. 61, pp. 268–278, March 1973) or the Bahl algorithm (L. R. Bahl, J. Cocke, F. Jelinek, and J. Raviv, "Optimal decoding of linear codes for minimizing symbol error rate," *IEEE Trans. Inform. Theory*, vol. IT-20, pp. 284–287, March 1974)). The general trend in many applications is towards higher data rates and therefore fast algorithms and architectures are desired.

There are two basic performance (speed) aspects of a data detection circuit architecture. The first is throughput which is a measurement of the number of bits per second the architecture can decode. The second is latency which is the end-to-end delay for decoding a block of N bits. Non-pipelined architectures are those that decode only one block at a time and for which the throughput is simply N divided by the latency. Pipelined architectures, on the other hand, may decode multiple blocks simultaneously, shifted in time, thereby achieving much higher throughput than their non-pipelined counterparts.

Depending on the application, the throughput and/or latency of the data detection hardware may be important. For example, the latency associated with interleaving in a turbo-coded system with relatively low data rate (less than 100 Kb/s) will likely dominate the latency of the iterative decoding hardware. For future high-rate systems, however, the latency due to the interleaver may become relatively small, making the latency of the decoder significant. While pipelined decoders can often achieve the throughput requirements, such techniques generally do not substantially reduce latency. In addition, sometimes latency has a dramatic impact on overall system performance. For example, in a data storage system (e.g., magnetic hard drives), latency in the retrieval process has a dramatic impact on the performance of the microprocessor and the overall computer. Such magnetic storage channels may use high-speed Viterbi processing with turbo-coded approaches.

The standard SISO algorithm is the forward-backward algorithm. The associated forward and backward recursion steps can be computed in parallel for all of the FSM states at a given time, yielding an architecture with O(N) computational complexity and latency, where N is the block size. The key result of this paper is the reformulation of the standard SISO computation using a combination of prefix and suffix operations, which leads to an architecture with O(lg N) latency. This architecture, referred to as a "tree-SISO", is based on a tree-structure for fast parallel prefix computations in the Very Large Scale Integration (VLSI) literature (e.g., fast adders).

This exponential decrease in latency for the tree-SISO comes at the expense of increased computational complexity and area. The exact value of these costs depends on the FSM structure (e.g., the number of states) and the details of the implementation. However, for a four-state convolutional code, such as those often used as constituent codes in turbo codes, the tree-SISO architecture achieves O(lg N) latency with computational complexity of O(N lg N). Note that, for this four-state example, the computation complexity of tree-SISO architecture increases sublinearly with respect to the associated speed-up. This is better than linear-scale solutions to the Viterbi algorithm (e.g., such as described in Fettweis, et al., "Parallel Viterbi algorithm implementation: Breaking the ACS-bottleneck" IEEE Trans. Commun., vol. 37, pp. 785–790, August 1989); the generalization of which to the SISO problem is not always clear. For this 4-state code example, the area associated with the O(lgN)-latency tree-SISO is O(N).

Soft-In Soft-Out Modules

Consider a specific class of finite state machines with no parallel state transitions and a generic S-state trellis. Such a trellis has up to S transitions departing and entering each state. The FSM is defined by the labeling of the state transitions by the corresponding FSM input and FSM output. Let $t_k=(s_k,a_k,s_{k+1})=(s_k,a_k)=(s_k,s_{k+1})$ be a trellis transition from state $s_k$ at time k to state $s_{k+1}$ in response to input $a_k$. Since there are no parallel state transitions, $t_k$ is uniquely defined by any of these representations. Given that the transition $t_k$ occurs, the FSM output is $x_k(t_k)$. Note that for generality the mapping from transitions to outputs is allowed to be dependent on k.

Consider the FSM as a system that maps a digital input sequence $a_k$ to a digital output sequence $x_k$. A marginal soft-inverse, or SISO, of this FSM can be defined as a mapping of soft-in (SI) information on the inputs $SI(a_k)$ and outputs $SI(x_k)$, to soft-output (SO) information for $a_k$ and/or $x_k$. The mapping is defined by the combining and marginalization operators used. It is now well-understood that one need only consider one specific reasonable choice for marginalization and combining operators and the results easily translate to other operators of interest. Thus, the focus is on the min-sum marginalization-combining operation with the results translated to max-product, sum-product, min*-sum, and max*-sum in a standard fashion. In all cases, let the indices $K_1$ and $K_2$ define the time boundaries of the combining window or span used in the computation of the soft-output for a particular quantity $u_k$ (e.g., $u_k=s_k$, $u_k=a_k$, $u_k=t_k$, $u_k=x_k=(s_k,s_{k+d})$, etc.). In general, $K_1$ and $K_2$ are functions of k. For notational compactness, this dependency is not explicitly denoted. For min-sum marginalization-combining, the minimum sequence metric (MSM) of a quantity $u_k$ is the metric (or length) of the shortest path or sequence in a combining window or span that is consistent with the conditional value of $u_k$. Specifically, the MSM is defined as follows. As is the standard convention, the metric of a transition that cannot occur under the FSM structure is interpreted to be infinity.

$$MSM_{K_1}^{K_2}(u_k) \triangleq \min_{t_{K_1}^{K_2}:u_k} M_{K_1}^{K_2}(t_{K_1}^{K_2}), \quad (1)$$

$$M_{K_1}^{K_2}(t_{K_1}^{K_2}) \triangleq \sum_{m=K_1}^{K_2} Mm(t_m) \quad (2)$$

$$Mm(t_m) \triangleq SI(a_m) + SI(x_m(t_m)), \quad (3)$$

where the set of transitions starting at time $K_1$ and ending at time $K_2$ that are consistent with $u_k$ is denoted $t_{K_1}^{K_2}:u_k$ and $t_{K_2}^{K_1}$ implicitly defines a sequence of transitions $t_{K_1}, t_{K_1+1}, \ldots, t_{K_2}$.

Depending on the specific application, one or both of the following "extrinsic" quantities will be computed $$SO_{K_1}^{K_2}(x_k) \triangleq MSM_{K_1}^{K_2}(x_k) - SI(x_k) \quad (4)$$

$$SO_{K_1}^{K_2}(a_k) \triangleq MSM_{K_1}^{K_2}(a_k) - SI(a_k) \quad (5)$$

Because the system on which the SISO is defined is an FSM, the combining and marginalization operations in (2)–(3) can be computed efficiently. The traditional approach is the forward-backward algorithm which computes the MSM of the states recursively forward and backward in time. Specifically, for the standard fixed-interval algorithm based on soft-in for transitions $t_k$, k=0, 1, ..., N−1, the following recursion based on add-compare-select (ACS) operations results:

$$f_k(s_k+1) \triangleq MSM_0^k(s_k+1) = \min_{t_k:s_{k+1}} [f_k-1(s_k) + M_k(t_k)] \quad (6)$$

$$b_k(s_k) \triangleq MSM_k^{N-1}(s_k) = \min_{t_k:s_k} [b_k+1(s_k+1) + M_k(t_k)] \quad (7)$$

where $f_{-1}(s_0)$ and $b_N(s_N)$ are initialized according to available edge information. Note that, since there are S possible values for the state, these state metrics can be viewed as (S×1) vectors $f_k$ and $b_k$. The final soft-outputs in (4)–(5) are obtained by marginalizing over the MSM of the transitions $t_k$ $$SO_0^{N-1}(u_k) = \min_{t_k:u_k} [f_k-1(s_k) + M_k(t_k) + b_{k+1}(s_{k+1})] - SI(u_k) \quad (8)$$

where $u_k$ is either $x_k$ or $a_k$. The operation in equation (8) is referred to as a completion operation.

While the forward-backward algorithm is computationally efficient, straightforward implementations of it have large latency (i.e., O(N)) due to ACS bottleneck in computing the causal and anticausal state MSMs.

Prefix and Suffix Operations

A prefix operation is defined as a generic form of computation that takes in n inputs $y_0, y_1, \ldots, y_{n-1}$ and produces n outputs $z_0, z_1, \ldots, z_{n-1}$ according to the following:

$$z_0 = y_0 \quad (9)$$

$$z_i = y_0 \ldots y_i, \quad (10)$$

where is any associative binary operator.

Similarly, a suffix operation can be defined as a generic form of computation that takes in n inputs $y_0, y_1, \ldots, y_{n-1}$ and produces n outputs $z_0, z_1, \ldots, z_{n-1}$ according to $$z_{n-1} = y_{n-1} \quad (11)$$

$$z_i = y_i \cdots y_{n-1}, \quad (12)$$

where is any associative binary operator. Notice that a suffix operation is simply a (backward) prefix operation anchored at the other edge.

Prefix and suffix operations are important since they enable a class of algorithms that can be implemented with low latency using tree-structured architectures. The most notable realizations of this concept are VLSI N-bit tree adders with latency O(lgN).

Reformulation of the SISO Operation

The proposed low-latency architecture is derived by formulating the SISO computations in terms of a combination of prefix and suffix operations. To obtain this formulation, define $C(S_k, S_m)$, for m>k, as the MSM of state pairs $s_k$ and $s_m$ based on the soft-inputs between them, i.e., $C(s_k, s_m) = \text{MSM}_k^{m-1}(s_k, s_m)$. The set of MSMs $C(s_k, s_m)$ can be considered an (S×S) matrix C(k,m). The causal state MSMs $f_{k-1}$ can be obtained from C(0,k) by marginalizing (e.g., minimizing) out the condition on $s_0$. The backward state metrics can be obtained in a similar fashion. Specifically, for each conditional value of $s_k$ $$f_{k-1}(s_k) = \min_{s_o} C(s_o, s_k) \quad (13)$$

$$b_k(s_k) = \min_{s_N} C(s_k, s_N) \quad (14)$$

With this observation, one key step of the algorithm is to compute C(0,k) and C(k, N) for k=0, 1, . . . , N−1. Note that the inputs of the algorithm are the one-step transition metrics which can be written as C(k, k+1) for k=0, 1, . . . , N−1. To show how this algorithm can be implemented with a prefix and suffix computation, a min-sum fusion operator on c matrices is defined that inputs two such matrices, one with a left-edge coinciding with the right-edge of the other, and marginalizes out the midpoint to obtain a pairwise state-MSM with larger span. Specifically, given $C(k_0, m)$ and $C(m, k_1)$, we define a C Fusion Operator, or $_C$ operator is defined by $$C(k_0, k_1) \triangleq C(k_0, m) \otimes_C C(m, k_1) \Leftrightarrow C(s_{k_0}, s_{k_1}) = \min_{s_m} [C(s_{k_0}, s_m) + C(s_m, s_{k_1})] \forall s_{k_0}, s_{k_1} \quad (15)$$

Note that the $_C$ operator is an associative binary operator that accepts two matrices and returns one matrix. This is illustrated in FIG. 1. With this definition C(0,k) and C(k, N) for k=0, 1, . . . , N−1 can be computed using the prefix and suffix operations as follows:

$$C(0,k) = C(0,1)_C C(1,2)_C \cdots _C C(k-1,k)$$

$$C(k,N) = C(k,k+1)_C \cdots C(N-2,N-1)_C C(N-1,N)$$

In general, a SISO algorithm can be based on the decoupling property of state-conditioning. Specifically, conditioning on all possible FSM state values at time k, the shortest path problems (e.g., MSM computation) on either side of this state condition may be solved independently and then fused together (e.g., as performed by the C-fusion operator). More generally, the SISO operation can be decoupled based on a partition of the observation interval with each subinterval processed independently and then fused together. For example, the forward-backward algorithm is based on a partition to the single-transition level with the fusing taking place sequentially in the forward and backward directions. In contrast, other SISO algorithms may be defined by specifying the partition and a schedule for fusing together the solutions to the sub-problems. This may be viewed as specifying an association scheme to the above prefix-suffix operations (i.e., grouping with parentheses).

The C-fusion operations may be simplified in some cases depending on the association scheme. For example, the forward-backward algorithm replaces all c-fusion operations by the much simpler forward and backward ACSs. However, latency is also a function of the association scheme. An architecture based on a pairwise tree-structured grouping is presented below. This structure allows only a small subset of the c-fusion operations to be simplified, but facilitates a significant reduction in latency compared to the forward-backward algorithm, by fusing solutions to the subproblems in a parallel, instead of sequential, manner.

Low-Latency Tree-SISO Architectures

Many low-latency parallel architectures based on binary tree-structured groupings of prefix operations can be adopted to SISOs such as described in Brent, et al., "A regular layout for parallel adders," IEEE Transactions on Computers, vol. C-31, pp. 260–264, March 1982; T. H. Cormen, et al., Introduction to Algorithms. Cambridge, Mass.: The MIT Press, 1990; and A. E. Despain, "Chapter 2: Notes on computer architecture for high performance," in New Computer Architectures, Academic Press, 1984. All of these have targeted n-bit adder design where the binary associative operator is a simple 1-bit addition. The present inventors were the first to recognize that parallel prefix-suffix architectures could be applied to an algorithm based on binary associative operators that are substantially more complex than 1-bit addition. Conventional parallel prefix architectures trade reduced area for higher latency and account for a secondary restriction of limited fanout of each computational module. This latter restriction is important when the computational modules are small and have delay comparable to the delay of wires and buffers (e.g., in adder design). The fusion operators, however, are relatively large. Consequently, given current VLSI trends, it is believed that they will dominate the overall delay for the near future. Thus, an architecture described herein minimizes latency with the minimal number of computational modules without regard to fanout.

Figure 2:
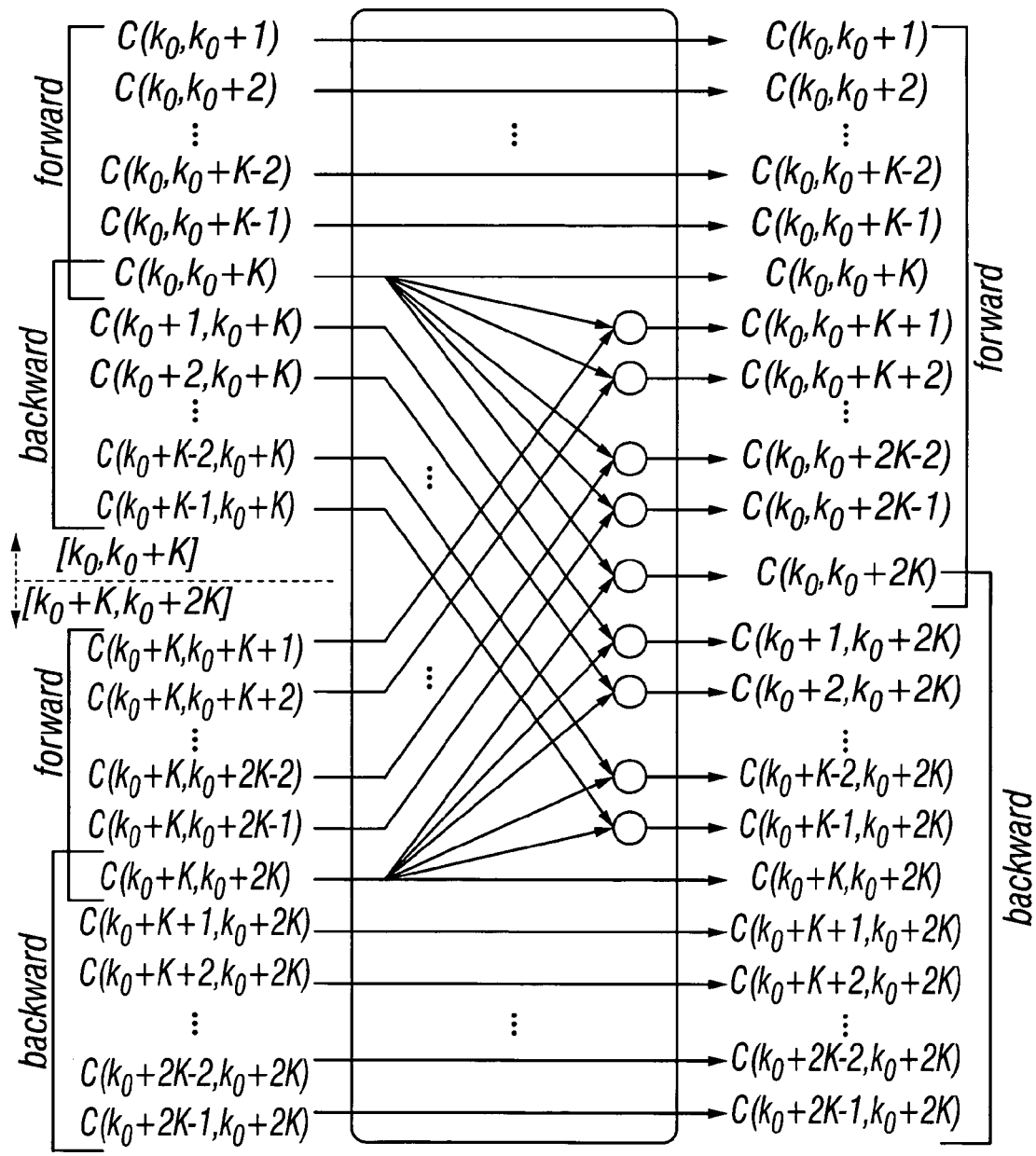
FIG. 2 shows a fusion module array for combining the complete set of C matrices on $[k_0, k_0+K]$ and $[k_0+K, k_0+2K]$ to obtain the complete set on $[k_0, k_0+2K]$.

Specifically, the forward and backward metrics, $f_{k-1}$ and $b_{N-k}$, for k=1, 2, . . . , N can be obtained using a hierarchal tree-structure based on the fusion-module (FM) array shown in FIG. 2. A complete set of c matrices on the interval $\{k_0, k_0+K\}$ as the 2K−1 matrices $C(k_0, k_0+m)$ and $C(k_0+m, k_0+K)$ for m=1,2, . . . , K−1 along with $C(k_0, k_0+K)$. This is the MSM information for all state pairs on the span of K steps in the trellis with one state being either on the left or right edge of the interval. The module in FIG. 2 fuses the complete sets of c matrices for two adjacent span-K intervals to produce a complete set of c matrices on the combined span of size 2K. Of the 4K−1 output C matrices, 2K are obtained from the 2(2K−1) inputs without any processing. The other 2K−1 output C matrices are obtained by 2K−1 C Fusion Modules, or CFMs, which implement the $_C$ operator.

Figure 3:
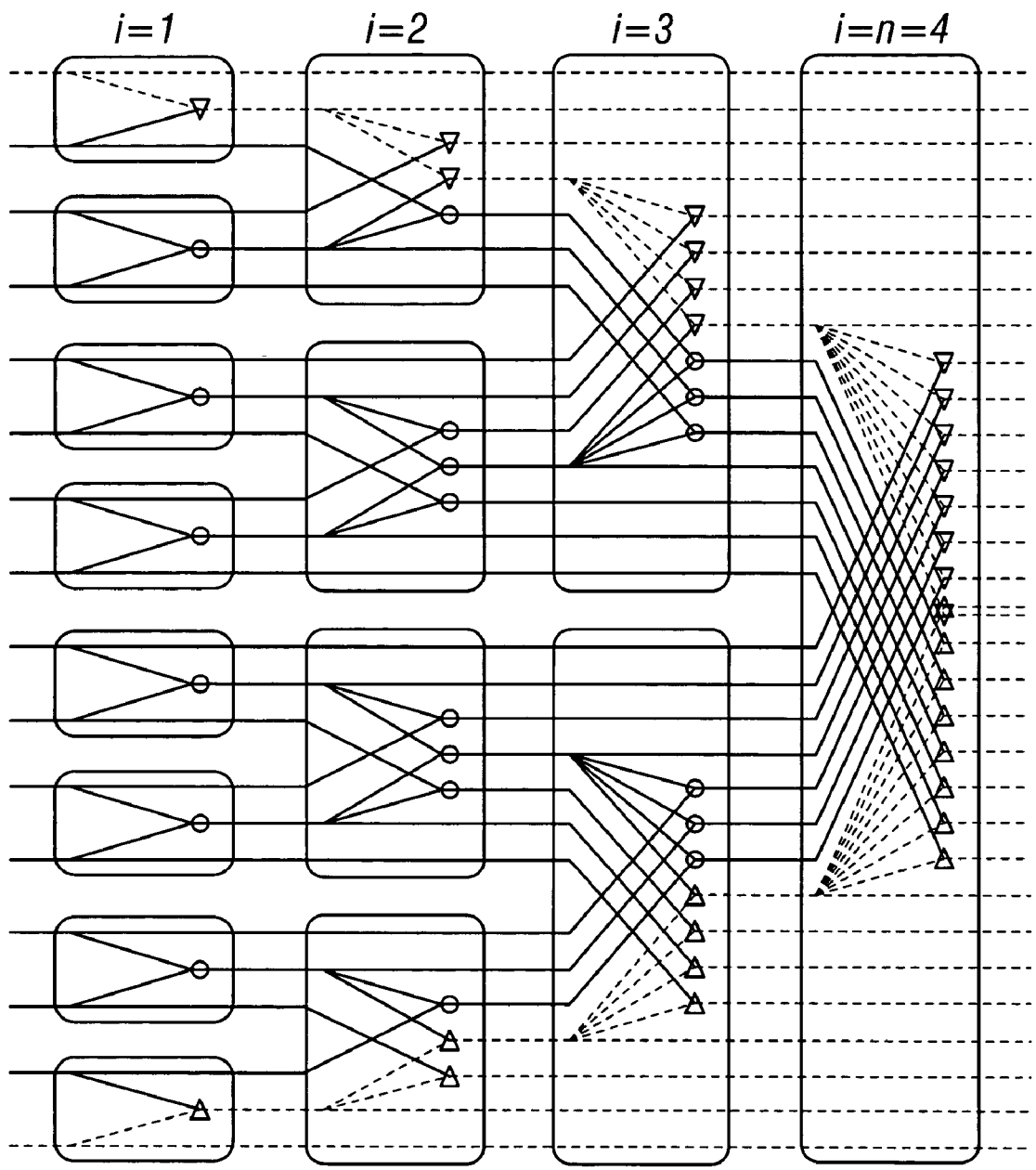
FIG. 3 shows a tree-SISO architecture for N=16.

The basic span-K to span-2K FM array shown in FIG. 2 can be utilized to compute the C matrices on the entire interval in lgN stages. This is illustrated in FIG. 3 for the special case of N=16. Note that, indexing the stages from left to right (i.e., increasing span) as i=1, 2, . . . , n=lgN it is clear that there are $2^{n-i}$ FM arrays in stage i.

Because the final objective is to compute the causal and anticausal state metrics, however, not all FM's need be CFMs for all FM arrays. Specifically, the forward state metrics $f_{k-1}$ can be obtained from $f_{m-1}$ and C(m,k) via $$f_{k-1}(s_k) = \min_{s_m}[f_{m-1}(s_m) + C(s_m, s_k)] \quad (16)$$

Similarly, the backward state metrics can be updated via $$b_k(s_k) = \min_{s_m}[b_m(s_m) + C(s_k, s_m)] \quad (17)$$

A processing module that produces an f vector from another f vector and a C matrix, as described in equation (16), is referred to as an f Fusion Module (fFM). A b Fusion Module (bFM) is defined analogously according to the operation in equation (17). FIG. 3 indicates which FM's may be implemented as fFMs or bFMs.

The importance of this development is that the calculation of the state metrics has O(lgN) latency. This is because the only data dependencies are from one stage to the next and thus all FM arrays within a stage and all FMs within an FM array can be executed in parallel, each taking O(1) latency. The cost of this low latency is the need for relatively large amounts of area. One mitigating factor is that, because the stages of the tree operate in sequence, hardware can be shared between stages. Thus, the stage that requires the most hardware dictates the total hardware needed. A rough estimate of this is N CFMs, each of which involves $S^2$ S-way ACS units with the associated registers. A more detailed analysis that accounts for the use of bFMs and fFMs whenever possible is set out below in the section heading "Hardware Resource Requirements". For the example in FIG. 3 and a 4-state FSM (i.e., S=4), stage 2 has the most CFMs (8), but stage 3 has the most processing complexity. In particular, the complexity of stages i=1,2,3,4 measured in terms of 4 4-way ACS units is 26, 36, 32, and 16, respectively. Thus, if hardware is shared between stages, a total of 36 sets of 4 4-way ACS units is required to execute all FMs in a given stage in parallel. For applications when this number of ACS units is prohibitive, one can reduce the hardware requirements by as much as a factor of S with a corresponding linear increase in latency.

The implementation of the completion operation defined in equation (8) should also be considered. The basic operation required is a Q-way ACS unit where Q is the number of transitions consistent with $u_k$. Assuming that at most half of the transitions will be consistent with $u_k$, Q is upper bounded by $S^2/2$. Consequently, when S is large, low-latency, area-efficient implementations of the completion step may become an important issue. Fortunately, numerous low-latency implementations are well-known (e.g., such as described in P. J. Black, *Algorithms and Architectures for High Speed Viterbi Decoding*. PhD thesis, Stanford University, California, March 1993.). One straightforward implementation may be one that uses a binary tree of comparators and has latency of $O(\lg S^2)$. For small S, this additional latency generally is not significant.

The computational complexity of the state metric calculations can be computed using simple expressions based on FIGS. 2 and 3. As described below in the section heading "Computation Complexity Analysis", the total number of computations, measured in units of S S-way ACS computations is $$N_{S,S}=N((\lg N-3)S+2)+4S-2 \quad (18)$$

For the example in FIG. 3 and a 4-state FSM, an equivalent of 110 sets of 4 4-way ACS operations are performed. This is to be compared with the corresponding forward-backward algorithm which would perform 2N=32 such operations and have baseline architectures with four times the latency. In general, note that for a reduction in latency from N to lgN, the computation is increased by a factor of roughly (½)(lgN−3)S+1. Thus, while the associated complexity is high, the complexity scaling is sub-linear in N.

Optimizations for Sparse Trellises

In general, the above architecture is most efficient for fully-connected trellises. For sparser trellis structures, however, the initial processing modules must process C-matrices containing elements set to ∞, accounting for MSMs of pairs of states between which there is no sequence of transitions, thereby wasting processing power and latency. Alternative embodiments may incorporate optimizations that address this inefficiency.

Consider as a baseline a standard 1-step trellis with $S=M^L$ states and exactly M transitions into and out of each state, in which, there exists exactly one sequence of transitions to go from a given state at time $s_k$ to a given state $s_{k+L}$. One optimization is to pre-collapse the one-step trellis into an R-step trellis, $1 \leq R \leq L$, and apply the tree-SISO architecture to the collapsed trellis. A second optimization is to, wherever possible, simplify the c fusion modules. In particular, for a SISO on an R-step trellis, the first lg(L/R) stages can be simplified to banks of additions that simply add incoming pairs of multi-step transition metrics.

More precisely, pre-collapsing involves adding the R metrics of the 1-step transitions that constitute the transition metrics of each super-transition $t_{kR}^{(k+1)R}$, for k=0,1, . . . , (N−1)/R. The SISO accepts these inputs and produces forward and backward MSMs, $f_{kR-1}(s_k)$ and $b_{(k+1)R}(s_{(k+1)R})$, for k=0, 1, . . . , N/R. One key benefit of pre-collapsing is that the number of SISO inputs is reduced by a factor of R, thereby reducing the number of stages required in the state metric computation by lgR. One potential disadvantage of pre-collapsing is that the desired soft-outputs must be computed using a more complex, generalized completion operation. Namely, $$SO_O^{NR-1}(u_{kR+m}) = \min_{t_{kR}^{(k+1)R}:u_{kR+m}} [f_{kR-1}(s_k) + M_{kR}^{(k+1)R}(t_{kR}^{(k+1)R}) + \quad (19)$$
$$b_{(k+1)R+1}(s_{(k+1)R})] - SI(u_{kR+m})$$
$$m = 0, 1, \ldots, R-1$$

One principal issue is that for each $u_{kR+m}$ this completion step involves an $(M^{L+R}/2)$-way ACS rather than the $(M^{L+1}/2)$-way ACS required for the 1-step trellis.

In order to identify the optimal R (i.e., for minimum latency) assuming both these optimizations are performed, the relative latencies of the constituent operations are needed. While exact latencies are dependent on implementation details, rough estimates may still yield insightful results. In particular, assuming that both the pre-collapsing additions and ACS operations for the state metric and completion operations are implemented using binary trees of adders/comparators, and their estimated delay is logarithmic in the number of their inputs. One important observation is that the pre-collapsing along with lgR simplified stages together add L 1-step transition metrics (producing the transition metrics for a fully-connected L-step trellis) and thus can jointly be implemented in an estimated lgL time units. In addition, the state metric ($M^L$)-way ACS units take lg$M^L$ time units and the completion units ($M^{L+R}/2$)-way ACSs take lg($M^{L+R}/2$) time units. Assuming maximal parallelism, this yields a total latency of $$\lg L + \lg(N/R)\lg(M^L) + \lg(M^{L+R}/2) \quad (20)$$

It follows that the minimum latency occurs when R−L lgR is minimum (subject to $1 \leq R \leq L$), which occurs when R=L. This suggests that the minimum-latency architecture is one in which the trellis is pre-collapsed into a fully-connected trellis and more complex completion units are used to extract the soft outputs from the periodic state metrics calculated.

The cost of this reduced latency is the additional area required to implement the trees of adders that produce the L-step transition metrics and the larger trees of comparators required to implement the more complex completion operations. Note, however, that this area overhead can be mitigated by sharing adders and comparators among stages of each tree and, in some cases, between trees with only marginal impact on latency.

Use in Tiled Sub-Window Schemes

The present inventors recognized that using smaller combining windows reduces latency and improves throughput of computing the soft-inverse. Minimum half-window (MHW) algorithms are a class of SISOs in which the combing window edges $K_1$ and $K_2$ satisfy $K_1 \leq \max(0, k-d)$ and $K_2 \geq \min(N, k+d)$, for k=0, . . . , N−1—i.e., for every point k away from the edge of the observation window, the soft-output is based on a sub-window with left and right edges at least d points from k.

Figure 4:
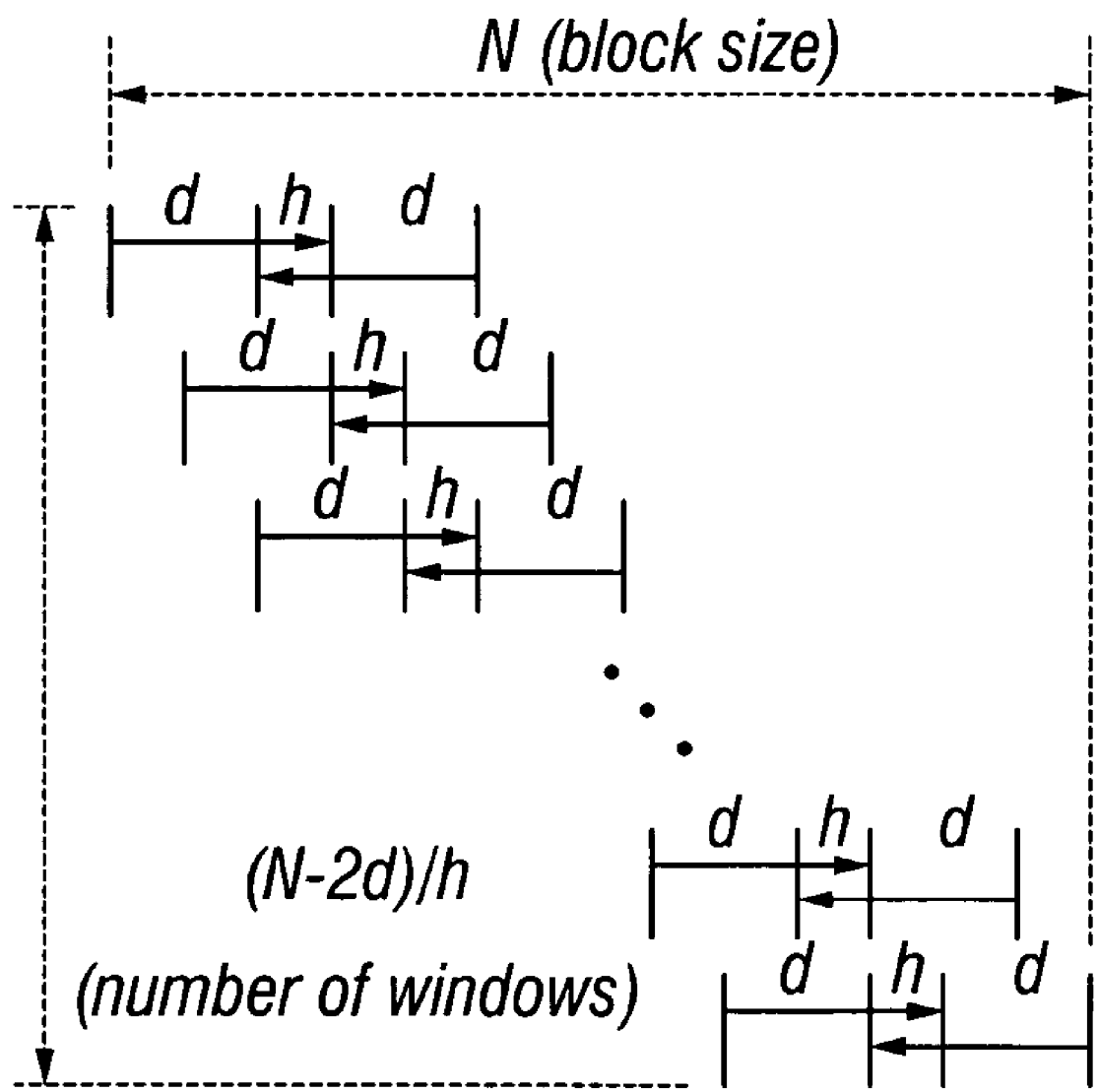
FIG. 4 shows a tiled sub-window scheme based on the forward-backward algorithm.

The traditional forward-backward algorithm can be used on sub-windows to obtain a MHW-SISO. One particular scheme is the tiled sub-window technique in which combining windows of length 2d+h are used to derive all state metrics. In this scheme, as illustrated in FIG. 4, the windows are tiled with overlap of length 2d and there are $$\frac{N-2d}{h}$$

such windows. The forward-backward recursion on each interior sub-window yields h soft outputs, so there is an overlap penalty which increases as h decreases.

For the $i^{th}$ such window, the forward and backward state metrics are computed using the recursions, modified from that of equations (6) and (7):

$$f_k^{(i)}(s_{k+1}) \triangleq MSM_{ih}^k(s_{k+1}) \quad (21)$$

$$b_k^{(i)}(s_k) \triangleq MSM_k^{ih+2d+h-1}(s_k) \quad (22)$$

If all windows are processed in parallel, this architecture yields a latency of O(d+h).

The tree-SISO algorithm can be used in a MHW scheme without any overlap penalty and with O(lgd) latency. Consider N/d combining windows of size d and let the tree-SISO compute C(id, id+j) and C((i+1)d, (i+1)d−j) for j=0, . . . , d−1 and i=0, . . . , N/d−1. Then, use one additional stage of logic to compute the forward and backward state metrics for all k time indices that fall within the $i_{th}$ window, i=0, . . . , N/d−1, as follows (this should be interpreted with $C(s_{-d}, s_0)$ replaced by initial left-edge information and similarly for $C(s_{N-1}, s_{N+d-1})$):

$$f_k^{(i)}(s_{k+1}) \triangleq MSM_{(i-1)d}^k(s_{k+1}) = \min_{s_{id}}\left\{\left[\min_{s_{(i-1)d}} C(s_{(i-1)d}, s_{id})\right] + C(s_{id}, s_{k+1})\right\}$$

$$b_k^{(i)}(s_k) \triangleq MSM_k^{(i+1)d}(s_k) = \min_{s_{id}}\left\{C(s_k, s_{id}) + \left[\min_{s_{(i+1)d}} C(s_{id}, s_{(i+1)d})\right]\right\}$$

Figure 5:
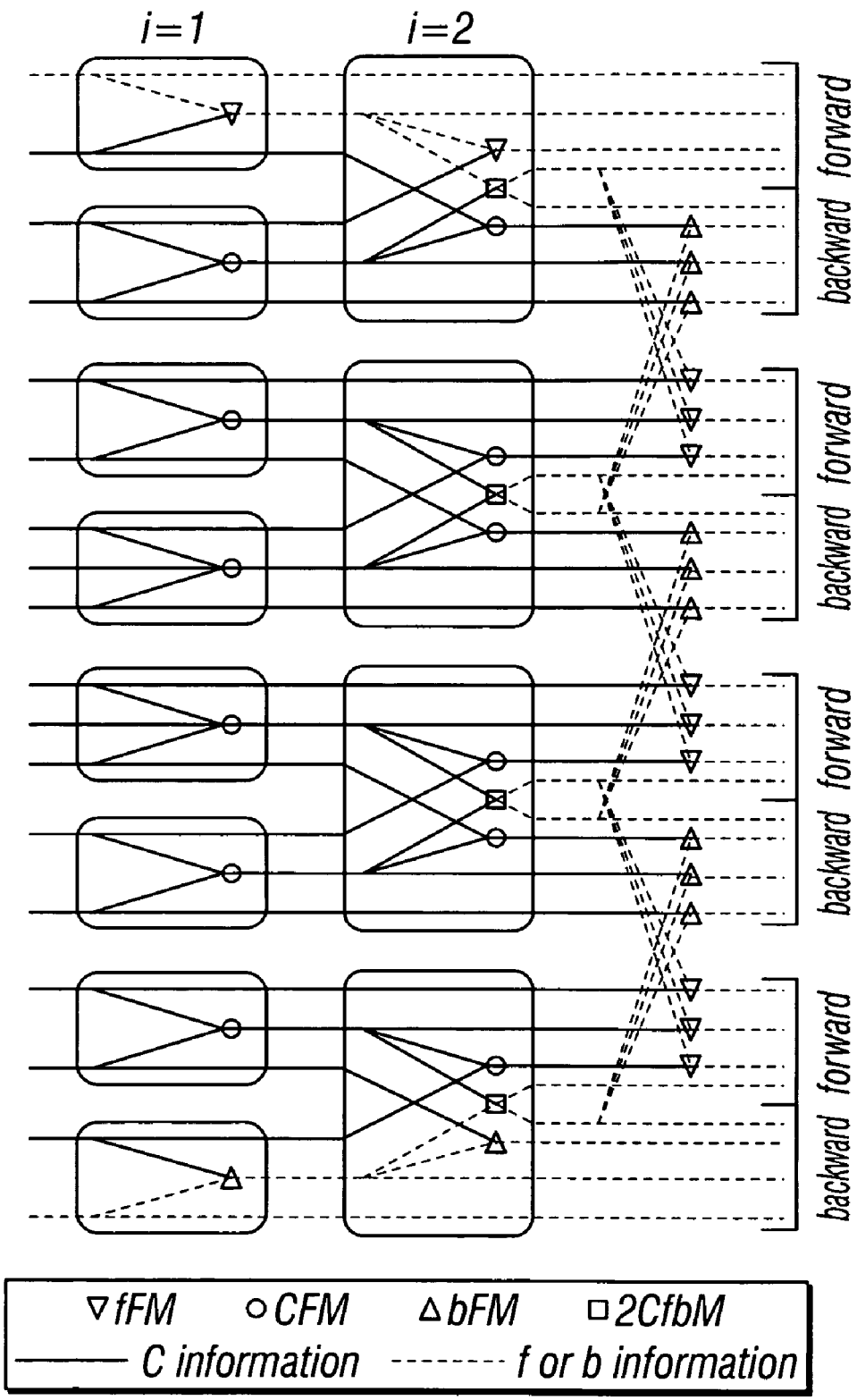
FIG. 5 shows a tiled sub-window approach with 4 tree-SISOs of window size 4 for N=16 to implement a d=4 MHW SISO.

The inner minimization corresponds to a conversion from c information to f (b) information as in equations (13) and (14). The outer minimization corresponds to an fFM or bFM. The order of this minimization was chosen to minimize complexity. This is reflected in the example of this approach, shown in FIG. 5, where the last stage of each of the four tree-SISOs is modified to execute the above minimizations in the proposed order. The module that does this is referred to as a 2Cfb module. This module may be viewed as a specialization of the stage 2 center CFMs in FIG. 3. The above combining of sub-window tree-SISO outputs adds one additional processing stage so that the required number of stages of FMs is lg(d)+1.

Computational Complexity Comparison

The computational complexity of computing the state metrics using the forward-backward tiled scheme is the number of windows times the complexity of computing the forward-backward algorithm on each window. In terms of S S-way ACSs, this can be approximated for large N via $$\frac{N-2d}{h}2(d+h) \approx \frac{2N}{h}(d+h) \quad (23)$$

The computational complexity of computing the state metrics using the tree-SISO tiled scheme in terms of S S-way ACSs can be developed similarly and is $$\frac{N}{d}d\lg(d)S + 2N = N(S\lg(d) + 2) \quad (24)$$

Determining which scheme has higher computational complexity depends on the relative sizes of h and d. If h is reduced, the standard forward-backward scheme reduces in latency but increases in computational complexity because the number of overlapped windows increase. Since the tiled tree-SISO architecture has no overlap penalty, as h is decreased in a tiled forward-backward scheme, the relative computational complexity trade-off becomes more favorable for the tree-SISO approach. In fact, for $$h < \frac{2d}{S\lg d},$$

the computational complexities of the tree-SISO are lower than for the tiled forward-backward scheme.

A Design Example: 4-state PCCC

The highly parallel architectures considered require large implementation area. In this example, an embodiment is described in which the area requirements are most feasible for implementation in the near future. Specifically, an iterative decoder based on 4-state sparse (one-step) trellises is considered. Considering larger S will yield more impressive latency reductions for the tree-SISO. This is because the latency-reduction obtained by the tree-SISO architecture relative to the parallel tiled forward-backward architecture depends on the minimum half-window size. One expects that good performance requires a value of d that grows with the number of states (i.e., similar to the rule-of-thumb for traceback depth in the Viterbi algorithm for sparse trellises). In contrast, considering pre-collapsing will yield less impressive latency reductions. For example, if d=16 is required for a single-step trellis, then an effective value of d=8 would suffice for a two-step trellis. The latency reduction factor associated with the tree-SISO for the former would be approximately 4, but only 8/3 for the latter. However, larger S and/or pre-collapsing yields larger implementation area and is not in keeping with our desire to realistically assess the near-term feasibility of these algorithms.

In particular, a standard parallel concatenated convolutional code (PCCC) with two 4-state constituent codes [1], [2] is considered. Each of the recursive systematic constituent codes generates parity using the generator polynomial $G(D)=(1+D^2)/(1+D+D^2)$ with parity bits punctured to achieve an overall systematic code with rate 1/2.

Figure 6:
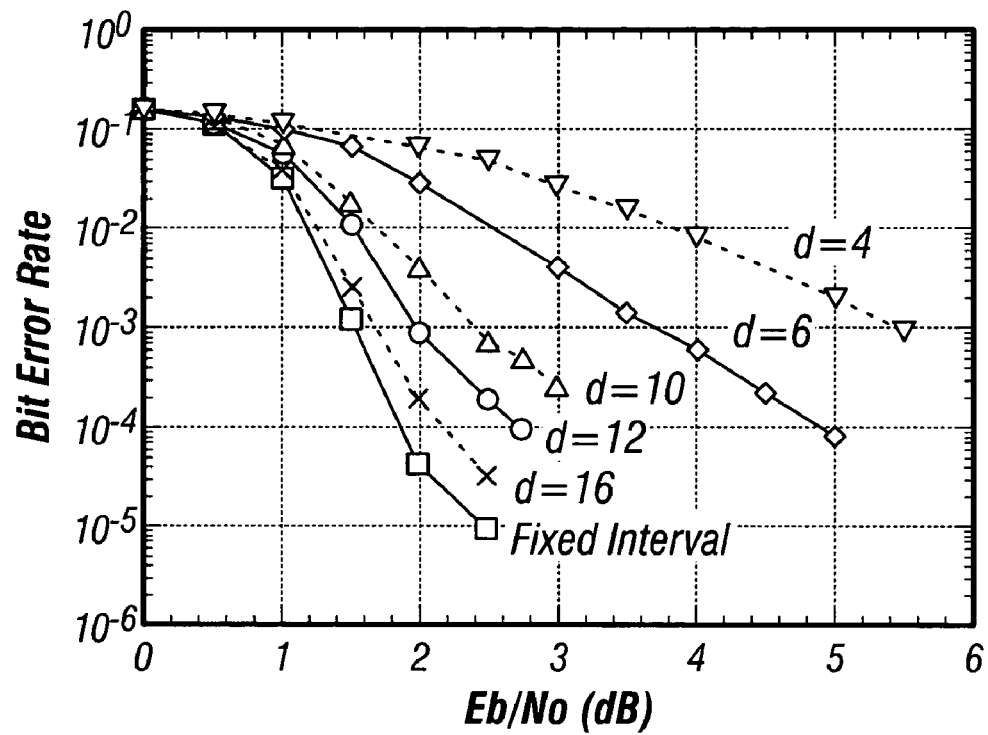
FIG. 6 is a graph showing a simulation of a standard turbo code for SISOs with various half-window sizes, N=1024, and ten iterations.
Figure 7A:
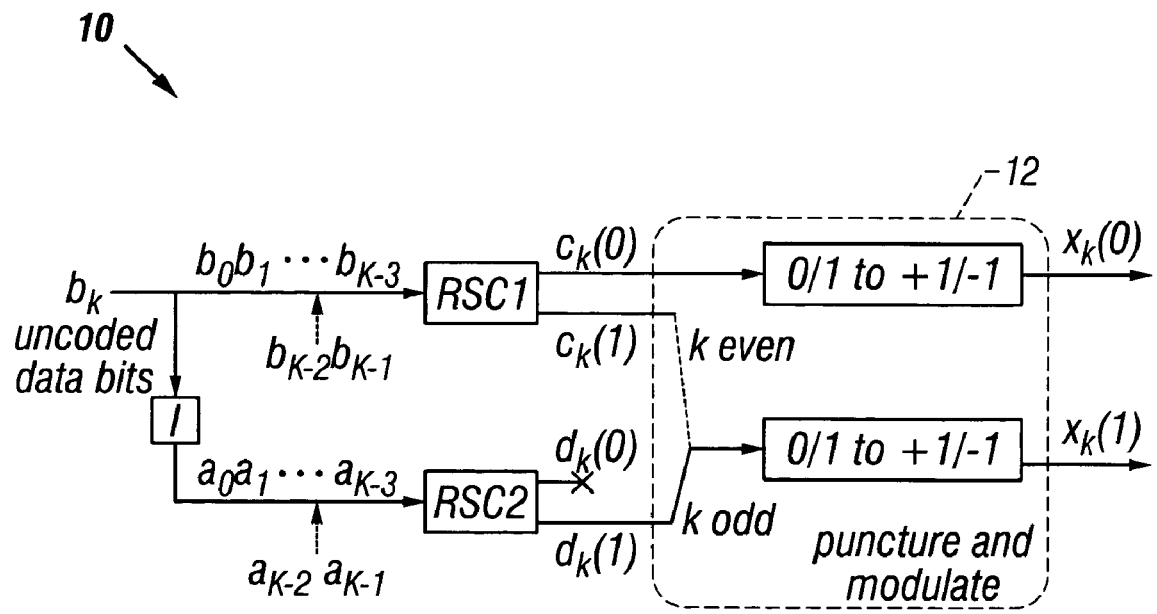
FIGS. 7A and 7B show examples of a turbo encoder and a turbo decoder, respectively.
Figure 7B:
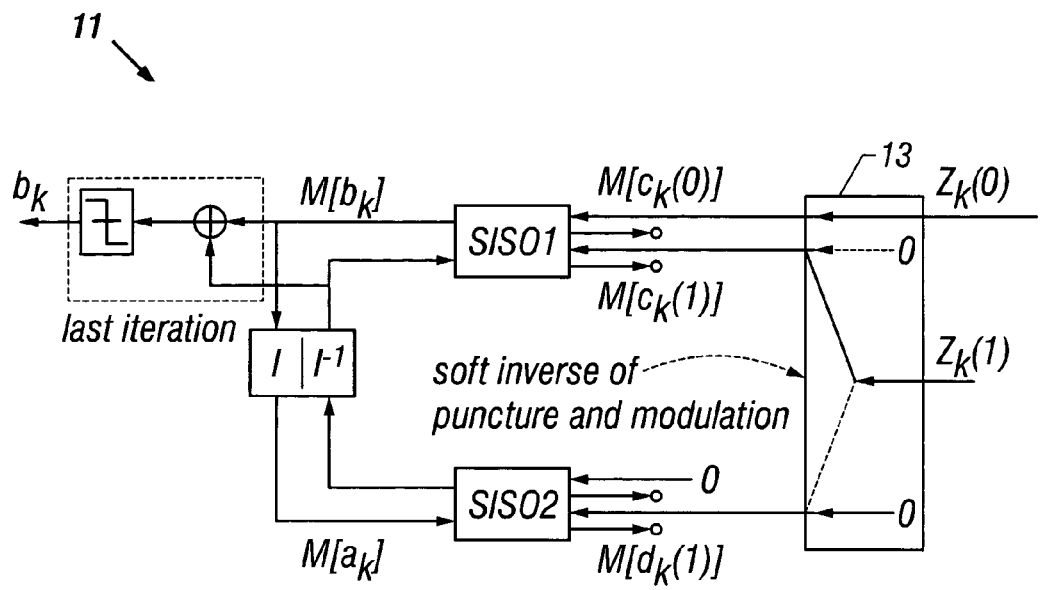

In order to determine the appropriate value for d to be used in the MHW-SISOs, simulations were performed where each SISO used a combining window $\{k-d, \ldots k+d\}$ to compute the soft-output at time k. This is exactly equivalent to the SISO operation obtained by a tiled forward-backward approach with h=1. Note that, since d is the size of all (interior) half-windows for the simulations, any architecture based on a MHW-SISO with d will perform at least as well (e.g., h=2 tiled forward-backward, d-tiled tree-SISO, etc.). Simulation results are shown in FIG. 6 for an interleaver size of N=1024 with min-sum marginalization and combining and ten iterations. The performance is shown for various d along with the performance of the fixed-interval (N=1024) SISO. No significant iteration gain is achieved beyond ten iterations for any of the configurations. The results indicate that d=16 yields performance near the fixed-interval case. This is consistent with the rule-of-thumb of five to seven times the memory for the traceback depth in a Viterbi decoder (i.e., roughly d=7×2=14 is expected to be sufficient).

Since the required window size is d=16, the latency improvement of a tree-SISO relative to a tiled forward-backward scheme is close to 4=16/lg(16). The computational complexity of these two approaches is similar and depends on the details of the implementation and the choice of h for the tiled forward-backward approach. A complete fair comparison generally would require a detailed implementation of the two approaches. Below a design for the tree-SISO based sub-window architecture is described.

A factor that impacts the area of the architecture is the bit-width of the data units. Simulation results suggest that an 8-bit datapath is sufficient. Roughly speaking, a tree-based architecture for this example would require 1024 sets of sixteen 4-way ACS units along with associated output registers to store intermediate state metric results. Each 4-way ACS unit can be implemented with an 8-bit 4-to-1 multiplexor, four 8-bit adders, six 8-bit comparators, and one 8-bit register. Initial VLSI designs indicate that these units require approximately 2250 transistors. Thus, this yields an estimate of 16×2250×1024≈40 Million transistors. This number or logic transistors pushes the limit of current VLSI technology but should soon be feasible. An architecture is considered in which one clock cycle is used per stage of the tree at a 200 MHz clock frequency. For d=16, each SISO operation can be performed in 6 such clock cycles (using one clock for the completion step). Moreover, assume a hard-wired interleaver comprising two rows of 1024 registers with an interconnection network. Such an interleaver would be larger than existing memory-based solutions, but could have a latency of 1 clock cycle. Consequently, one iteration of the turbo decoder, consisting of two applications of the SISO, one interleaving, and one deinterleaving, requires 14 clock cycles. Assuming ten iterations, the decoding of 1024 bits would take 140 clock cycles, or a latency of just 700 ns.

This latency also implies a very high throughput which can further be improved with standard pipelining techniques. In particular, a non-pipelined implementation has an estimated throughput of 1024 bits per 700 ns=1.5 Gb/second. Using the tree-SISO architecture one could also pipeline across interleaver blocks as described by Masera et al., "VLSI architectures for turbo codes," *IEEE Transactions on VLSI*, vol. 7, September 1999. In particular, 20 such tiled tree-SISOs and associated interleavers can be used to achieve a factor of 20 in increased throughput, yielding a throughput of 30 Gb/second.

Moreover, unlike architectures based on the forward-backward algorithm, the tree-SISO can easily be internally pipelined, yielding even higher throughputs with linear hardware scaling. In particular, if dedicated hardware is used for each stage of the tree-SISO, pipelining the tree-SISO internally may yield another factor of lg(d) in throughput, with no increase in latency. For window sizes of d=16, the tree-based architecture could support over 120 Gb/second. That said, it is important to realize that with current technology such hardware costs may be beyond practical limits. Given the continued increasing densities of VLSI technology, however, even such aggressive architectures may become cost-effective in the future.

Computation Complexity Analysis

The number of required stages is n=lgN, with $2^{n-i}$ FM arrays in stage i. Each of these FM arrays in stage i span $2^i$ steps in the trellis and contains of $2^i-1$ FMs. Thus, the total number of FMs in stage i is $n_{FM}(i)=(2^i-1)2^{n-i}$. The total number of fusion operations is therefore $$N_{FM} = \sum_{i=1}^{n} n_{FM}(i) \qquad (25)$$

$$= \sum_{i=1}^{n} 2^n - 2^n 2^{-i}$$

$$= Nn - N\sum_{i=1}^{n} 2^{-i}$$

$$= N(lgN - 1) + 1$$

For the example in FIG. 3, this reduces to $N_{FM}=49$.

Using FIG. 3 as an example, it can be seen that the number of FMs that can be implemented as fFMs in stage i is $n_f(i)=2^{i-1}$. In the special case of i=n, this is interpreted as replacing the 2K−1 CFMs by K fFMs and K bFMs. For example, in the fourth stage in FIG. 3, the 15 CFMs implied by FIG. 2 may be replaced by 8 fFMs and 8 bFMs, as shown. The number of FMs that can implemented as bFMs is the same—i.e., $n_b(i)=n_f(i)=2^{i-1}$. It follows that the number of CFMs required at stage i is $$n_C(i) = n_{FM}(i) - n_b(i) - n_f(i) + \delta(n-i) \quad (26)$$

$$= 2^n - 2^{n-1} - 2^i + \delta(n-i) \quad (27)$$

where $\delta(j)$ is the Kronecker delta. The total number of fusion modules is therefore $$N_f = N_b = \sum_{i=1}^{n} n_f(i) = \sum_{i=1}^{n} 2^{i-1} = N - 1 \quad (28)$$

$$N_C = \sum_{i=1}^{n} n_C(i) \quad (29)$$

$$= N(n-1) + 1 - \left(\sum_{i=1}^{n} 2^i\right) + 1$$

$$= N(\lg N - 3) + 4$$

Comparing equations (25) and (29), it is seen that, for relatively large N, the fraction of FMs that must be CFMs is (lg N−3)/(lg N−1). For smaller N, the fraction is slightly larger. For example, in FIG. 3, $N_f=N_b=15$ and there are 20 CFMs.

The CFM is approximately S (i.e., the number of states) times more complex than the fFM and bFM operations. This can be seen by comparing equation (15) with equations (16) and (17). Specifically, the operations in equations (15), (16), and (17) involve S-way ACSs. For the CFM, an S-way ACS must be carried out for every possible state pair $(s_{k_0}, s_{k_1})$ in (15)—i.e., $S^2$ state pairs. The S-way ACS operations in equations (16), and (17) need only be computed for each of the S states $s_k$. Thus, taking the basic unit of computation to be S S-way ACS on an S-state trellis, the total number of these computations required for stage i is $$n_{S,S}(i) = S n_C(i) + n_f(i) + n_b(i) \quad (30)$$

Summing over stages, the total number of computations is obtained, measured in units of S S-way ACS computations $$N_{S,S} = SN_C + 2N_f = N((\lg N - 3)S + 2) + 4S - 2 \quad (31)$$

For the example in FIG. 3 and a 4-state FSM, an equivalent of 110 sets of S S-way ACS operations are performed. This is to be compared with the corresponding forward-backward algorithm which would perform 2N=32 such operations and have baseline architectures with four times the latency. In general, note that the for a reduction in latency from N to lg N, the computation is increased by a factor of roughly (½)(lg N−3) S+1. Thus, while the associated complexity is high, the complexity scaling is sub-linear in N. For small S, this is better than linear-scale solutions to low-latency Viterbi algorithm implementations (e.g., such as described in P. J. Black, *Algorithms and Architectures for High Speed Viterbi Decoding*. PhD thesis, Stanford University, California, March 1993; and Fettweis, et al., "Parallel Viterbi algorithm implementation: Breaking the ACS-bottleneck" IEEE Trans. Commun., vol. 37, pp. 785–790, August 1989).

Hardware Resource Requirements

The maximum of $n_{S,S}(i)$ over i is of interest because it determines the minimum hardware resource requirements to achieve the desired minimum latency. This is because the fusion modules can be shared between stages with negligible impact on latency.

The maximum of $n_{S,S}(i)$ can be found by considering the condition on i for which $n_{S,S}(i) \geq n_{S,S}(i-1)$. Specifically, if i<n, $$n_{S,S}(i) \geq n_{S,S}(i-1) \quad (32)$$

$$\Leftrightarrow 2^n \geq 2^{2i-1}(1 - S^{-1}) \quad (33)$$

$$\Leftrightarrow i \leq \frac{n + 1 - \lg(1 - S^{-1})}{2} \quad (34)$$

It follows that $n_{S,S}(i)$ has no local maxima and $$i^* = \left\lfloor \frac{n + 1 - \lg(1 - S^{-1})}{2} \right\rfloor \quad (35)$$

can be used to find the maximizer of $n_{S,S}(i)$. Specifically, if equation (35) yields i*<n−1, then the maximum occurs at i*, otherwise (i*=n−1), the i=n−1 and i=n cases should be compared to determine the maximum complexity stage. For $S \geq 4$, equation (35) can be reduced to $$i^* = \left\lfloor \frac{n+1}{2} \right\rfloor \quad (36)$$

since $0.5 \leq \frac{1 - \lg(1 - S^{-1})}{2} \leq 0.71$ for $S \geq 4$.

Other Embodiments of a Tree-Structured SISO

Figure 8A:
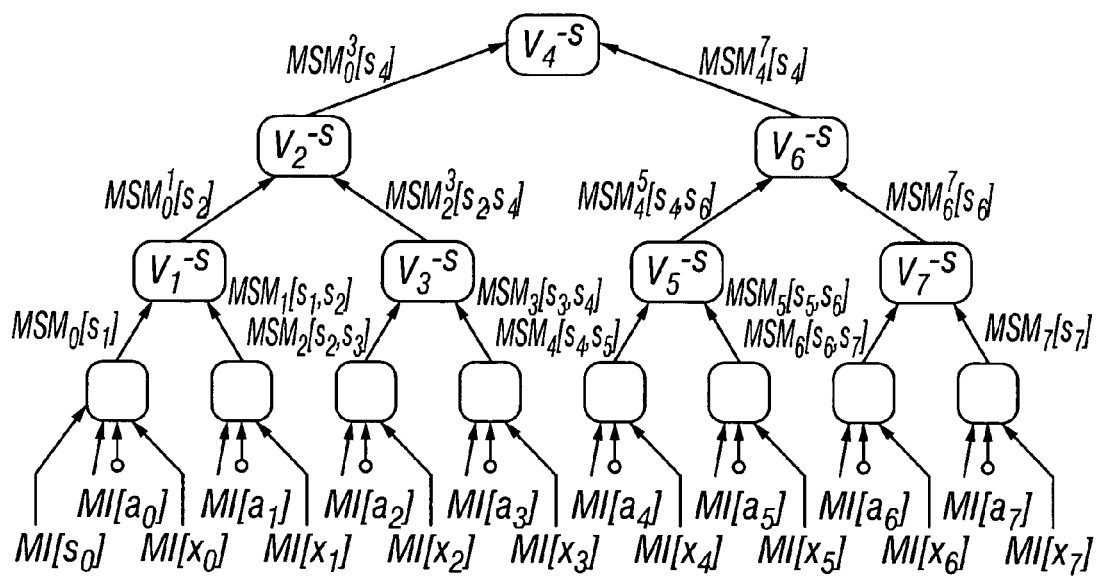
FIGS. 8A and 8B show a forward-backward tree-SISO (FBT-SISO) implementation.
Figure 8B:
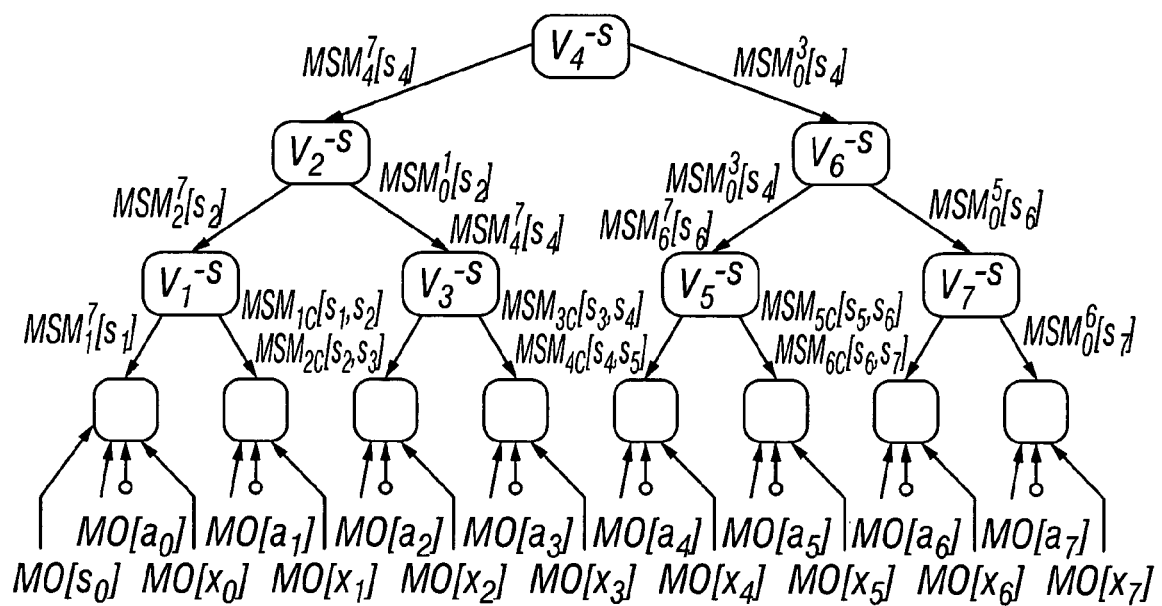

Generally, in implementing a tree-structured SISO, any of various tree structures can be used that represent a trade-off between latency, computational complexity and IC area according to the system designer's preferences. FIGS. 8A and 8B show an embodiment referred to as a Forward-Backward Tree-SISO (FBT-SISO). In the FBT-SISO, the tree structure recursion is bi-directional—inward and outward. As a result, the FBT-SISO has twice the latency of the Tree-SISO, but it also achieves a significant decrease in computational complexity and uses less area on an integrated circuit (IC) chip.

Details of message passing using the generalized forward-backward schedule are shown in FIGS. 8A and 8B in min-sum processing. The inward messages are shown in FIG. 8A. Specifically, initially MI[tk] is set to uniform and the algorithm begins by activating the first level of subsystems to compute Mk[tk] from MI[x(tk)] and MI[a(tk)]. The messages passed inward to the next level of the tree are MSMk[sk, sk+1] which is simply Mk[tk] if there are no parallel transitions. This inward message passing continues with the messages shown. When the two messages on s4 reach V4-s, the outward propagation begins and proceeds downward as shown in FIG. 8B. Again, all nodes at a given level of the tree are activated before activating any of the nodes at the next level. At the bottom level, the input metric of (sk, sk+1) is MSM{k}c[sk, sk+1]—i.e., the sum of the forward and backward state metrics in the standard forward-backward algorithm. Thus, the final activation of the nodes on the bottom level produces the desired extrinsic output metrics.

This FBT-SISO has twice the latency of the Tree-SISO because the messages must propagate both inward and outward. This modest increase in latency is accompanied by a significant reduction in computational complexity. Specifically, the FBT-Tree SISO has O(K) computational complexity and O(log2K) latency. This is to be compared to O(K log2K) computational complexity and O(log2K) latency for the Tree-SISO and O(K) computational complexity and O(K) latency for message passing on the standard trellis.

Other embodiments of a tree-structured SISO may be advantageous depending on the designer's goals and constraints. In general, a tree-structured SISO can be constructed that uses virtually any type of tree structure. For example, advantageous results may be obtained with a tree-structured SISO that uses one or more of the tree structures described in R. P. Brent and H. T. Kung, "A regular layout for parallel adders," IEEE Transactions on Computers, C-31:260–264 (March 1982) (the "Brent-Kung tree"); A. E. Despain, "New Computer Architectures," Chapter 2: Notes on computer architecture for high performance, Academic Press (1984); T. H. Cormen, C. Leiserson, and R. L. Rivest, "Introduction to Algorithms," The MIT Press (1990); and/or S. M. Aji and R. J. McEliece, "The generalized distributive law," IEEE Trans. Inform. Theory, 46(2):325–343 (March 2000).

Figure 9:
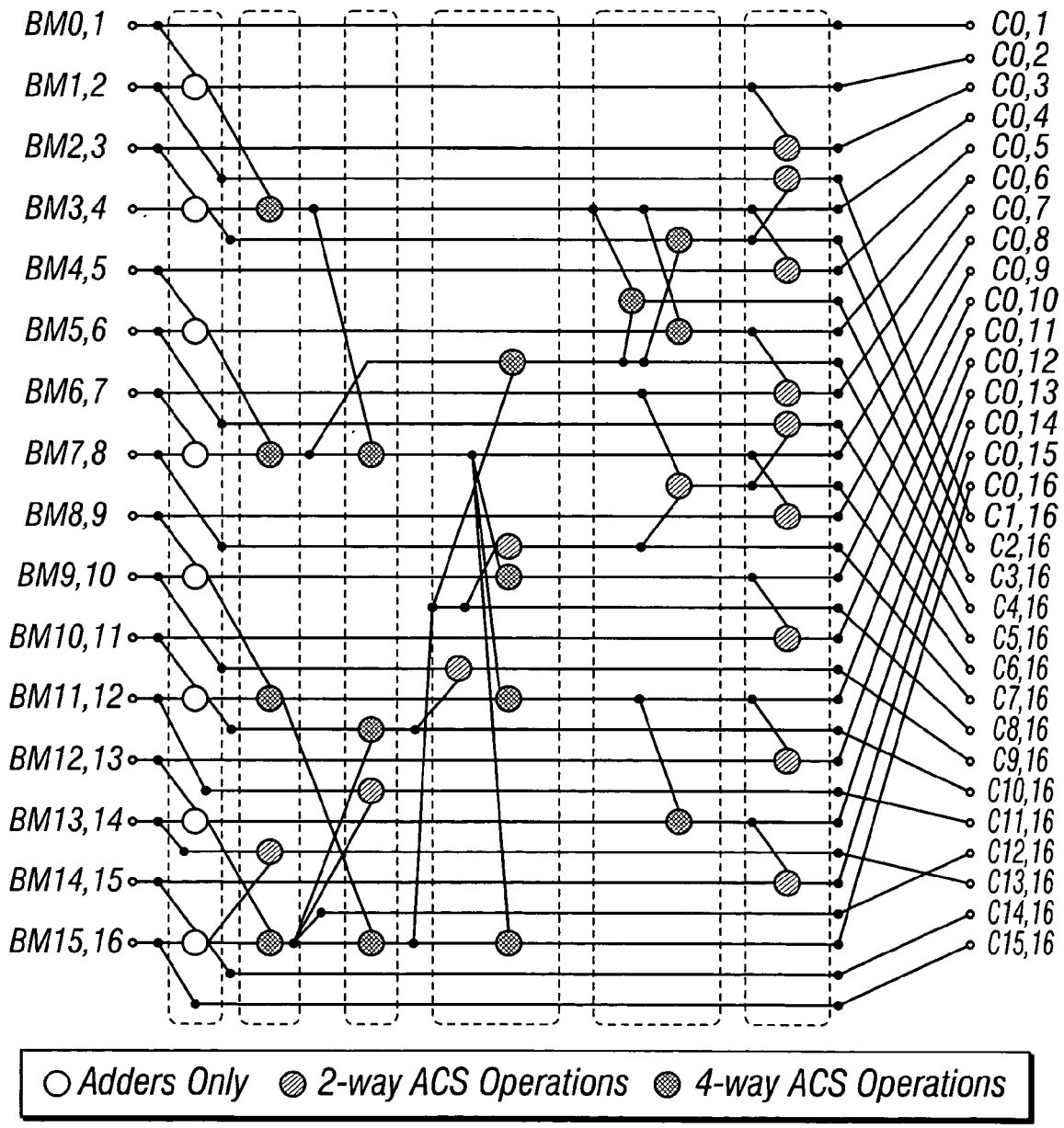
FIG. 9 shows an embodiment of a Brent-Kung Tree-SISO.

FIG. 9 shows a representation of a Brent-Kung Tree-SISO in which calculation of the branch metrics in a d=16 sub-window uses a modified version of the Brent-Kung model. There are six pipeline stages in the Brent-Kung Tree-SISO which are indicated by the dotted lines. Nodes with hatching represent a 2-way ACS while the nodes with cross-hatching represent a 4-way ACS.

The Brent-Kung Tree-SISO is based on the Brent-Kung parallel adder. It was created to solve the fan-out problem of the prefix adders. Additionally it reduces the amount of hardware needed for the calculation of all the metrics. The fusion operation is also used here, but the amount of fusion operations needed is significantly reduced. In the Brent-Kung adder, instead of additions, fusion operations are performed at each node. In this form only the forward information can be calculated. The model was modified so that the calculation of both the forward and backward metrics could be performed at the same time.

Figure 10:
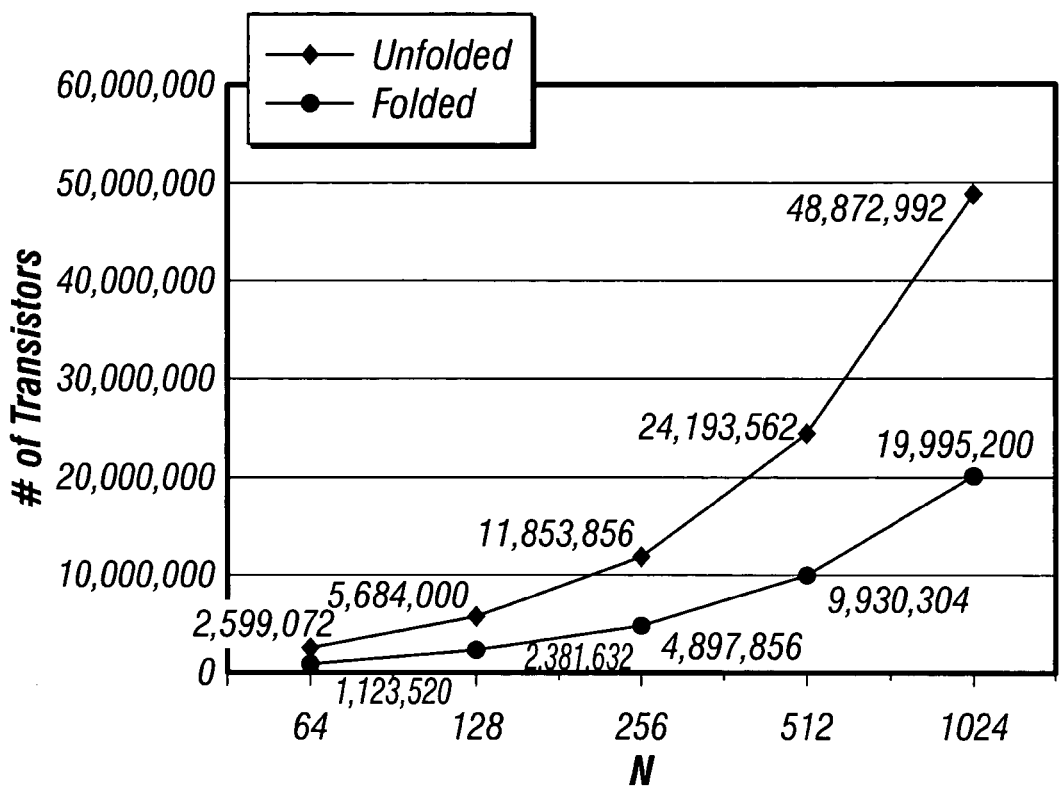
FIG. 10 is a graph showing transistor count estimations for the Brent-Kung Tree-SISO approach of FIG. 9.

This model firstly reduces the number of units that have to be driven by the output of an ACS. In the worst case here, 4 units feed on the output of a single stage (i.e. node C0,8). This is almost half of what the previous approach needed. It is also observed that there is a significant number of operations that only need 2-way ACS units. Considering that the 2-way ACS unit uses less than half of the hardware needed in a 4-way ACS unit, the total size of the circuitry is expected to drop considerably. An analysis similar to the one performed before, verifies this intuitive assumption. The results are summarized in FIG. 10.

Advantages presented by this approach may be counter-balanced with a reduction in the system's performance. A close look at the block diagram in FIG. 10 indicates that the longest path for the calculations is now 6 cycles long. Adding the three extra cycles needed for the forward and backward metric calculation, the completion step and the interleaving process brings the total delay of the SISO module to 9 cycles. This means that for the whole decoding process takes 180 cycles. Assuming that the same cells are used for implementation, this yields a total time of 540 nsec for processing one block of 1024 bits of data. The throughput of the system in this case will be 1.896 Gbps. If the unfolded design pipelined after each ACS step is used, that would allow one block to be processed after each step, and a throughput of 16.82 Gbps could be realized. If 20 SISOs were used to unfold the loop, the throughput would be 341.32 Gbps. For the first case, which is of interest due to the size of the design, the performance degradation is only about 24.1%. At the same time the number of transistors needed to implement this design is reduced by almost 43.8%.

Decoding Block Codes and Concatenated Blocks with the Tree-Structure SISO

There are other relevant decoding problems in which the conventional solution is to run the standard forward-backward algorithm on a trellis. The methods and techniques described herein also can be applied in place of the forward-backward algorithm in order to reduce the processing latency in these applications. One example of such an application is computing the soft inversion of a block error correction code using the trellis representation of the code. A method for decoding a block code using a trellis representation was described in Robert J. McEliece, "On the BCJR Trellis for Linear Block Codes," IEEE Transactions on Information Theory," vol. 42, No. 4, July 1996. In that paper, a method for constructing a trellis representation based on the parity-check structure of the code is described. Decoding, or more generally soft-inversion of the block code, can be accomplished by running the forward-backward algorithm on this trellis. The methods and techniques described herein can be applied to determine the soft-inversion of a block code in a manner similar to the tree-structured methods for soft-inversion of an FSM. Specifically, the forward and backward state metrics can be computed to find the soft-inversion of a block code by using a parallel prefix computational architecture with tree-structure.

The application of the tree-SISO architecture to implementing the soft-inverse of a block code via the parity check structure is significant as a practical matter because several attractive turbo-like codes are based on the concatenation of simple parity check codes. These codes are often referred to as "turbo-like codes" since they have similar performance and are decoded using iterative algorithms in which soft-inverse nodes accept, update and exchange soft-information on the coded bits. Specific examples of turbo-like codes include: Low-Density Parity Check Codes (LDPCs) also known as Gallager codes and product codes (also known as turbo-block codes), which are described in J. Hagenauer, E. Offer, and L. Papke, "Iterative decoding of binary block and convolutional codes," IEEE Transactions on Information Theory, 42(2):429–445, March 1996, and R. G. Gallager, "Low-Density Parity-Check Codes," MIT Press, Cambridge, Mass., 1963.

Figure 11:
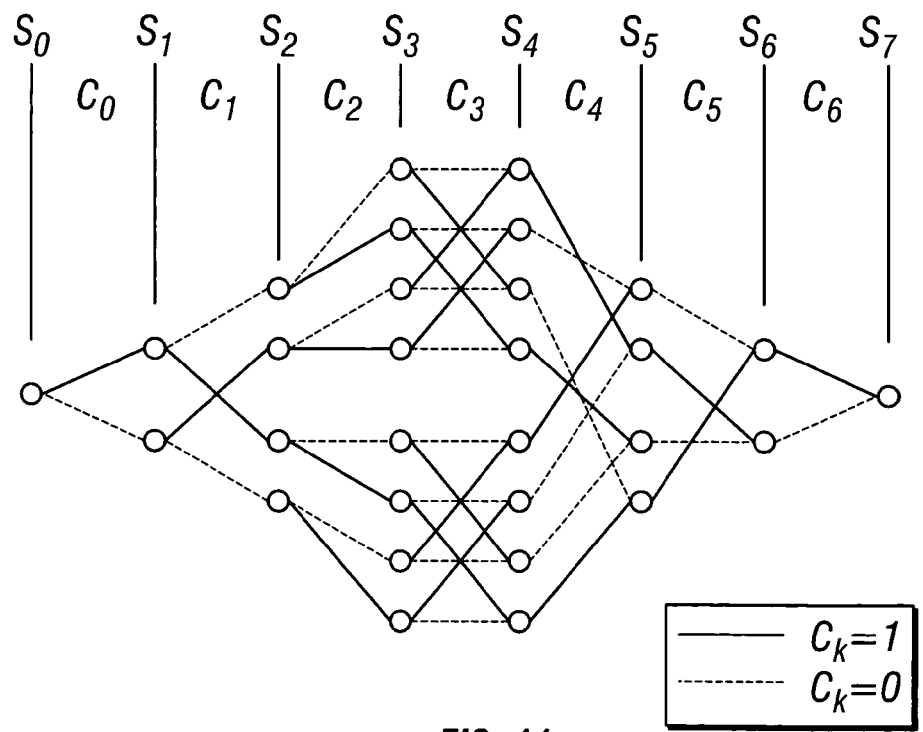
FIG. 11 shows the trellis structure for the parity check for a standard Hamming (7,4) code.

As a specific example, the parity check trellis for a standard Hamming(7,4) code is shown in FIG. 11. The forward-backward algorithm may be run on this trellis with latency on the order of 7. Alternatively, a tree-SISO architecture can be used resulting in the computational structure shown in FIG. 12. As in the case of FSM soft-inversion, the tree-structured computation yields the same forward and backward state metrics as the conventional solution method (i.e., running the standard forward-backward algorithm on a trellis), but has logarithmic latency (roughly ½ the latency in this simple example). In general, for a block code with length N, the conventional approach based on the forward-backward algorithm will have latency O(N), whereas the same computation can be computed using the tree-SISO with latency O(lg N).

Figure 12:
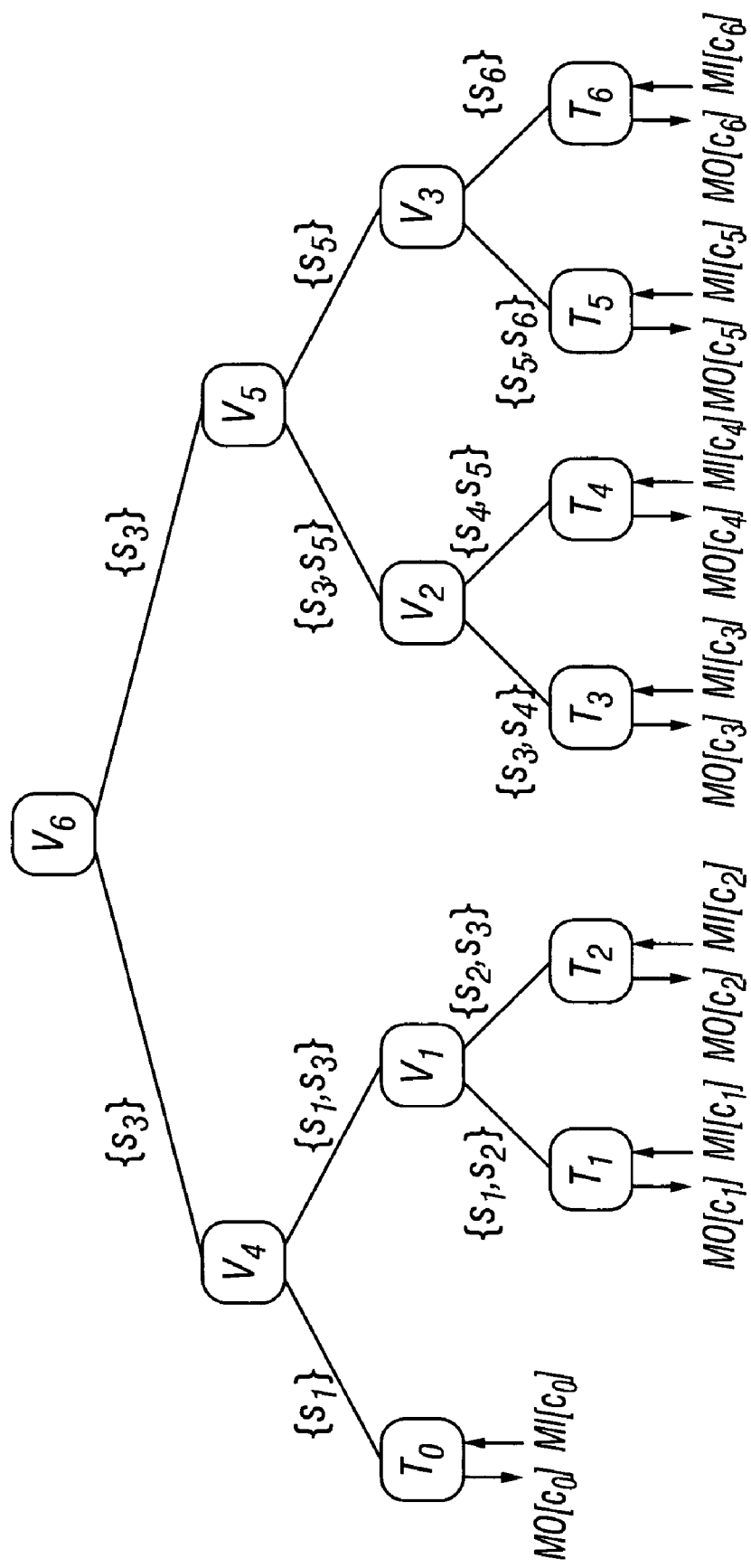
FIG. 12 shows a tree structured representation of the Hamming code parity check, in which the forward-backward-tree-SISO algorithm may be run on this tree with an inward (up) set of message passes to the node labeled V6, followed by an outward (down) set of message passes to produce the desired soft-out metrics on the coded bits.
Figure 13:
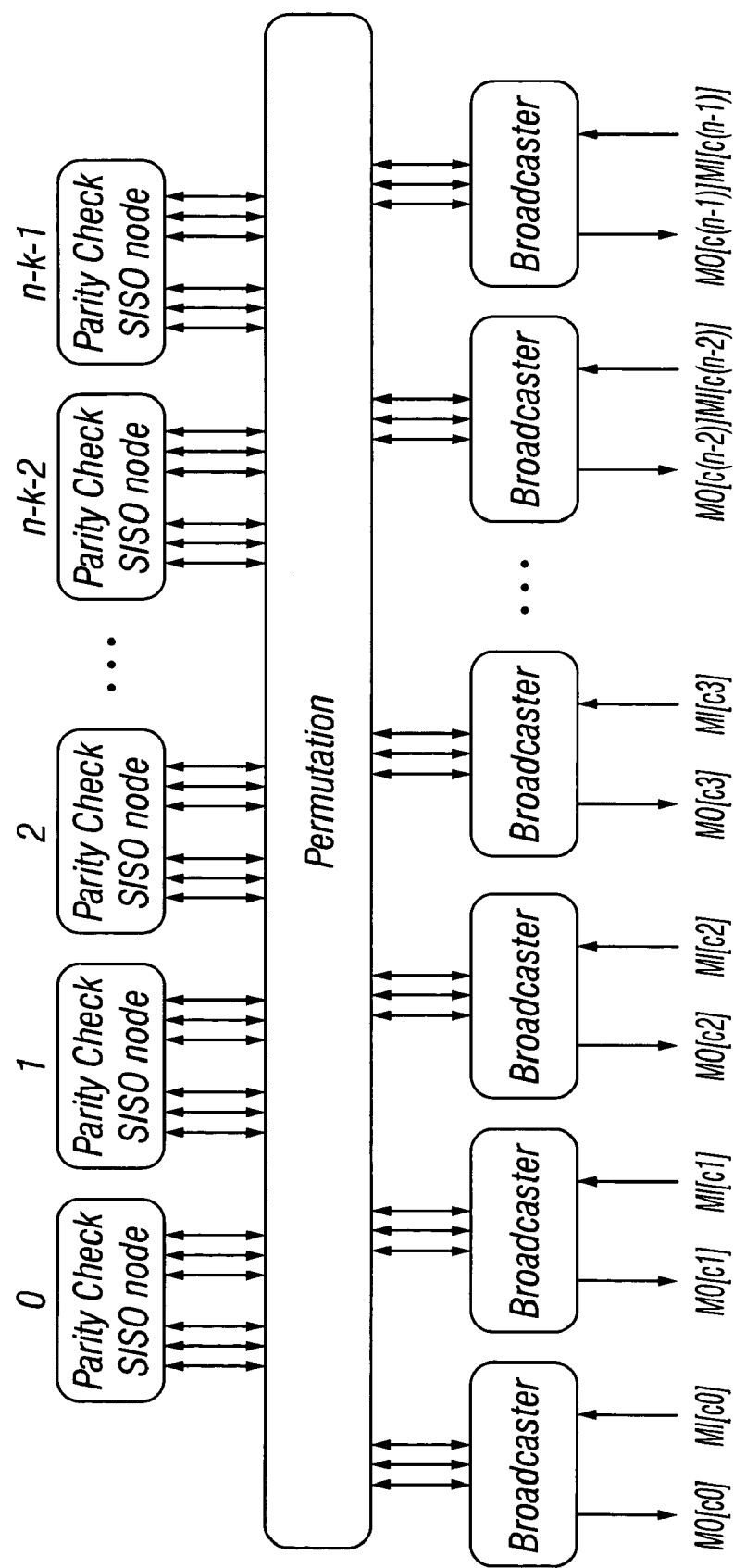
FIG. 13 shows an example of an LDPC decoder (overall code rate of 0.5) in which beliefs are passed from the broadcaster nodes to the parity check nodes through a fixed permutation, and in which the parity check nodes can be implemented as a tree-structured SISO.

As a specific example of the use for a tree-structured parity check node SISO such as the one illustrated in FIG. 12, consider the iterative decoder for an LDPC, as illustrated in FIG. 13. This decoder has two basic types of soft-inverse processing nodes: the soft broadcaster nodes and the parity-check SISO nodes. In one embodiment, the decoder executes by activating the soft-broadcaster nodes in parallel, followed by permuting the generated soft-information which becomes the input to the parity check SISO nodes. These nodes are activated producing updated beliefs on the coded bit values that are passed back through the permutation and become the input to the soft-broadcaster. This may be viewed as a single iteration. Several iterations are required before the decoding procedure is complete. As in turbo decoding, the stopping criterion is part of the design, with a common choice being a fixed number of iterations. The computation shown in FIG. 11 is performed in each parity check SISO node in a preferred embodiment. Alternatively, the tree-structured architecture can be used for the computation at each parity check SISO node. In the most common form, the parity check nodes in LDPCs are single-parity checks, and therefore have a two-state trellis-representation.

CONCLUSION

Based on the interpretation of the SISO operation in terms of parallel prefix/suffix operations, a family of tree-structured architectures are described above. Compared to the baseline forward-backward algorithm architecture, the tree-SISO architecture reduces latency from O(N) to O(lgN). Alternative tree-structured SISOs, such as the FBT-SISO, trade a linear increase in latency for substantially lower complexity and area.

An efficient SISO design generally is not built using a single tree-SISO, but rather using tree-SISOs as important components. For example, as described above, many tree-SISOs were used to comprise a SISO using tiled sub-windows. Latency in that example reduced from linear in the minimum half-window size (d) for fully-parallel tiled architectures based on the forward-backward algorithm, to logarithmic in d for tiled tree-SISOs.

In general, potential latency advantages of the tree-SISO are clearly most significant for applications requiring large combining windows. For most practical designs, this is expected when the number of states increases. In the one detailed 4-state tiled-window example considered, the latency was reduced by a factor of approximately 4. For systems with binary inputs and S states, one would expect that $d \cong 8 \lg(S)$ would be sufficient. Thus, there is a potential reduction in latency of approximately $8 \lg(S)/\lg(8 \lg S)$ which becomes quite significant as S increases. However, the major challenge in achieving this potential latency improvement is the area required for the implementation. In particular, building a high-speed S-way ACS unit for large S is the key challenge. Techniques to reduce this area requirement without incurring performance degradations (e.g., bit-serial architectures) are promising areas of research. In fact, facilitating larger S may allow the use of smaller interleavers, which alleviates the area requirements and reduces latency.

Various implementations of the systems and techniques described here may be realized in digital electronic circuitry, integrated circuitry, specially designed ASICs (application specific integrated circuits) or in computer hardware, firmware, software, or combinations thereof.

A number of embodiments of the present invention have been described. Nevertheless, it will be understood that various modifications may be made without departing from the spirit and scope of the invention. Accordingly, other embodiments are within the scope of the following claims.

What is claimed is:

1. A soft-in/soft-out (SISO) module comprising:
a plurality of fusion modules arranged into a tree structure and adapted to perform parallel prefix and parallel suffix operations to compute forward and backward state metrics, respectively,
wherein each fusion module is defined by the equation:

$$C(k_0, k_1) \stackrel{\Delta}{=} C(k_0, m) \otimes_C C(m, k_1) \Longleftrightarrow C(s_{k_0}, s_{k_1}) = \min_{s_m}[C(s_{k_0}, s_m) + C(s_m, s_{k_1})] \forall s_{k_0}, s_{k_1}$$

where C(k, m) is a matrix of minimum sequence metrics (MSM) of state pairs $s_k$ and $s_m$ based on soft-inputs between $s_k$ and $s_m$.

2. The SISO module of claim 1 wherein at least one of the fusion modules computes forward and backward state metrics by performing recursive marginalization-combining operations.

3. The SISO module of claim 2 wherein the recursive marginalization-combining operations comprise min-sum operations.

4. The SISO module of claim 2 wherein the recursive marginalization-combining operations comprise min*-sum operations.

5. The SISO module of claim 2 wherein min*=min(x,y)–ln(1+e$^{-|x-y|}$).

6. The SISO module of claim 2 wherein the recursive marginalization-combining operations comprise sum-product operations.

7. The SISO module of claim 2 wherein the recursive marginalization-combining operations comprise max-product operations.

8. A soft-in/soft-out (SISO) module comprising:
one or more complete fusion modules (CFMs) for performing marginalization-combining operations in both a forward direction and a backward direction;
one or more forward fusion modules (fFMs) for performing marginalization-combining operations only in the forward direction; and
one or more backward fusion modules (bFMs) for performing marginalization-combining operations only in the backward direction,
wherein the one or more CFMs, fFMs, and bFMs are arranged into a tree structure and adapted to perform parallel prefix and parallel suffix operations to compute forward and backward state metrics, respectively.

9. The SISO module of claim 8 wherein an amount of the CFMs is a minimum number needed to compute a soft-inverse.

10. The SISO module of claim 9 wherein fFMs and bFMs are used in the tree structure in place of CFMs wherever possible.

11. The SISO module of claim 8 wherein the marginalization-combining operations performed by one or more of the fusion modules comprise min-sum operations.

12. The SISO module of claim 8 wherein the recursive marginalization-combining operations comprise min*-sum operations.

13. The SISO module of claim 12 wherein $\min^* = \min(x, y) - \ln(1 + e^{-|x-y|})$.

14. The SISO module of claim 8 wherein the recursive marginalization-combining operations comprise sum-product operations.

15. The SISO module of claim 8 wherein the recursive marginalization-combining operations comprise max-product operations.

16. The SISO module of claim 8 wherein the tree structure comprises at least one of a Brent-Kung tree and a forward-backward tree (FBT).

* * * * *